US011106077B2

(12) United States Patent
Imada et al.

(10) Patent No.: US 11,106,077 B2
(45) Date of Patent: Aug. 31, 2021

(54) LIGHT EMITTING MODULE AND METHOD OF MANUFACTURING THE SAME

(71) Applicant: NICHIA CORPORATION, Anan (JP)

(72) Inventors: Mamoru Imada, Anan (JP); Toshiaki Moriwaki, Itano-gun (JP); Yusaku Achi, Tokushima (JP); Ryohei Yamashita, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/528,955

(22) Filed: Aug. 1, 2019

(65) Prior Publication Data

US 2020/0041836 A1 Feb. 6, 2020

(30) Foreign Application Priority Data

Aug. 3, 2018 (JP) .............................. JP2018-146667

(51) Int. Cl.
*H01L 33/48* (2010.01)
*G02F 1/1335* (2006.01)
*H01L 33/50* (2010.01)

(52) U.S. Cl.
CPC ...... *G02F 1/133514* (2013.01); *H01L 33/504* (2013.01); *H01L 2933/0041* (2013.01)

(58) Field of Classification Search
CPC ........ G02F 2001/133614; G02F 2001/133607; G02F 1/133605; G02F 1/133606
See application file for complete search history.

(56) References Cited

U.S. PATENT DOCUMENTS

| 10,627,672 B2* | 4/2020 | Jang ................... G02F 1/133603 |
| 10,930,624 B2* | 2/2021 | Kasai ................... G02B 6/0021 |
| 2004/0190304 A1* | 9/2004 | Sugimoto ............... H01L 33/54 |
| | | 362/555 |
| 2005/0226636 A1* | 10/2005 | Hiramatsu .......... H01S 5/02234 |
| | | 398/182 |
| 2007/0147073 A1 | 6/2007 | Sakai et al. |
| 2011/0018017 A1 | 1/2011 | Bierhuizen et al. |

(Continued)

FOREIGN PATENT DOCUMENTS

| JP | 2000249837 A | 9/2000 |
| JP | 2005038776 A | 2/2005 |

(Continued)

*Primary Examiner* — Andrew J Coughlin
(74) *Attorney, Agent, or Firm* — Hunton Andrews Kurth LLP

(57) ABSTRACT

A light emitting module includes: a plurality of light emitting elements each having a primary light emitting surface; a plurality of wavelength conversion members arranged respectively on the primary light emitting surfaces of the plurality of light emitting elements; a resin member arranged between the plurality of wavelength conversion members and covering lateral surfaces of the plurality of wavelength conversion members; and a lightguide plate having a first primary surface and a second primary surface, and arranged on the resin member and the plurality of wavelength conversion members so that the second primary surface faces the resin member and the plurality of wavelength conversion members, wherein the lightguide plate includes a plurality of recessed portions on the second primary surface that are located over the plurality of wavelength conversion members.

22 Claims, 21 Drawing Sheets

(56) References Cited

U.S. PATENT DOCUMENTS

| | | | |
|---|---|---|---|
| 2011/0149594 A1 | 6/2011 | Terajima et al. | |
| 2013/0258663 A1* | 10/2013 | Woodgate | F21V 13/04 |
| | | | 362/236 |
| 2015/0036317 A1 | 2/2015 | Yamamoto et al. | |
| 2017/0067618 A1 | 3/2017 | Wagatsuma et al. | |
| 2017/0082790 A1* | 3/2017 | Cho | G02B 6/003 |
| 2017/0307799 A1* | 10/2017 | Shani | G02B 6/0003 |
| 2018/0095329 A1 | 4/2018 | Shimizu | |
| 2019/0018184 A1* | 1/2019 | Miyashita | G02B 6/0091 |
| 2019/0097097 A1* | 3/2019 | Ko | G02F 1/133606 |
| 2019/0227382 A1* | 7/2019 | Watanabe | F21V 5/04 |

FOREIGN PATENT DOCUMENTS

| | | |
|---|---|---|
| JP | 2007188863 A | 7/2007 |
| JP | 2007207572 A | 8/2007 |
| JP | 2007227286 A | 9/2007 |
| JP | 2008059786 A | 3/2008 |
| JP | 2011096494 A | 5/2011 |
| JP | 2011165434 A | 8/2011 |
| JP | 2011210674 A | 10/2011 |
| JP | 2012533902 A | 12/2012 |
| JP | 2015032373 A | 2/2015 |
| WO | 2012141094 A1 | 10/2012 |
| WO | 2013046081 A1 | 4/2013 |
| WO | 2015133045 A1 | 9/2015 |
| WO | 2016171109 A1 | 10/2016 |

\* cited by examiner

LIGHT EMITTING MODULE AND METHOD OF MANUFACTURING THE SAME

CROSS-REFERENCE TO RELATED APPLICATION

This application claims priority to Japanese Patent Application No. 2018-146667, filed on Aug. 3, 2018, the disclosure of which is hereby incorporated by reference in its entirety.

BACKGROUND

The present disclosure relates to a light emitting module and a method of manufacturing the same.

Light emitting devices using light emitting elements such as light emitting diodes are widely used as backlights of liquid crystal display devices or as various light sources. For example, the light source device disclosed in Japanese Patent Publication No. 2015-32373 includes a plurality of light emitting elements mounted on a mounting substrate, semispherical lens members respectively covering the light emitting elements, and a diffuser member arranged thereabove upon which light from the light emitting elements is incident.

SUMMARY

In recent years, there has been a demand for thinner display devices, and hence for thinner backlights. With such a light source device as that disclosed in Japanese Patent Publication No. 2015-32373, for example, the distance between the mounting substrate and the diffuser needs to be larger than the thickness of the lens members, and it may be difficult to achieve a sufficient thickness reduction. The present disclosure provides a light emitting module whose thickness can be reduced.

A light emitting module according to one embodiment of the present disclosure includes: a plurality of light emitting elements each having a primary light emitting surface; a plurality of wavelength conversion members arranged respectively on the primary light emitting surfaces of the plurality of light emitting elements; a resin member arranged between the plurality of wavelength conversion members and covering lateral surfaces of the plurality of wavelength conversion members; and a lightguide plate having a first primary surface and a second primary surface, and arranged on the resin member and the plurality of wavelength conversion members so that the second primary surface faces the resin member and the plurality of wavelength conversion members, wherein the lightguide plate includes a plurality of recessed portions on the second primary surface that are located over the plurality of wavelength conversion members.

According to the present disclosure, it is possible to realize a thin light emitting module.

DETAILED DESCRIPTION

Embodiments of light emitting modules according to the present disclosure will now be described in detail with reference to the drawings. Note that while terms indicating specific directions and positions (e.g., "upper", "lower", and other terms including such terms) are used as necessary in the description below, these terms are used for ease of understanding of the present disclosure with reference to the drawings, and the technical scope of the subject matter of the present disclosure is not limited by the meaning of these terms. Each part with the same reference sign appearing in different figures represents the same or equivalent part or member.

Moreover, the embodiment to be shown below is for illustrating a light emitting module that embodies the technical concept of the subject matter of the present disclosure, and it is not intended to limit the subject matter of the present disclosure to the description below. The size, material, shape, relative arrangement, etc., of the components described below are intended to be illustrative but not to limit the scope of the subject matter of the present disclosure thereto, unless otherwise specified. Descriptions used in one embodiment or example are applicable to other embodiments or other examples. The size, positional relationship, etc., of the members shown in each figure may be exaggerated in order to facilitate the understanding.

(Liquid Crystal Display Device 1000)

Figure 1:
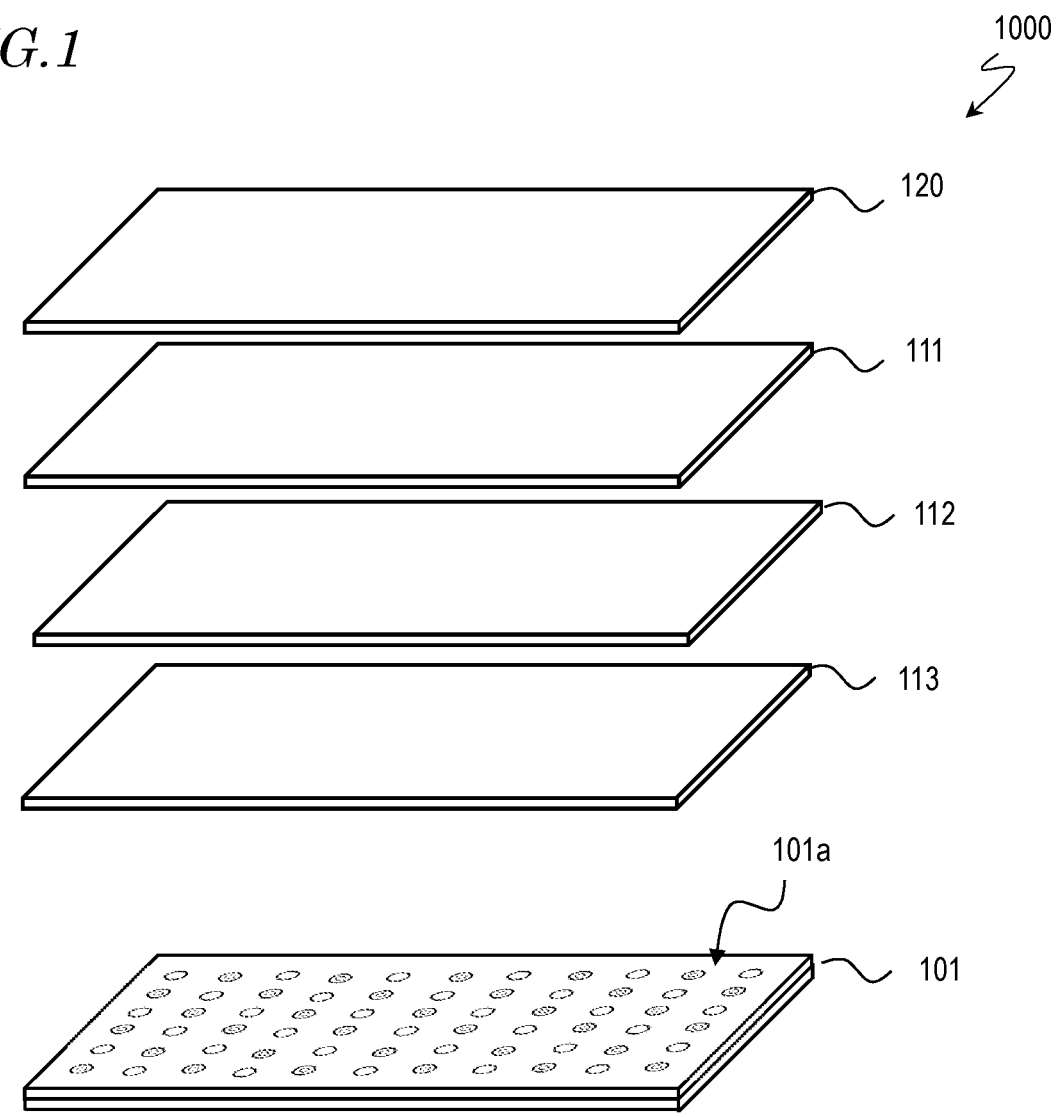
FIG. 1 is an exploded perspective view showing a liquid crystal display device of a first embodiment of the present disclosure.

FIG. 1 is a schematic exploded perspective view showing elements of a liquid crystal display device 1000 of the present embodiment. The liquid crystal display device 1000 includes a light emitting module 101, a liquid crystal panel 120, and lens sheets 111 and 112 and a diffusion sheet 113 located between the light emitting module 101 and the liquid crystal panel 120. In the present embodiment, the diffusion sheet 113 is arranged on the light emitting module 101 side relative to the lens sheets 111 and 112.

The number of lens sheets and the number of diffusion sheets of the liquid crystal display device 1000 are not limited to those shown in FIG. 1. For example, the liquid crystal display device 1000 may include two or more diffusion sheets. The liquid crystal display device 1000 may further include other members such as a polarizer film, a color filter, a luminance enhancement film and a reflector.

The light emitting module 101 is a surface-emitting light source and emits light from across the entirety of a primary surface 101a. Light emitted from the light emitting module 101 is randomly diffused when passing through the diffusion sheet 113. Thus, the unevenness in luminance is suppressed. The lens sheets 111 and 112 refract light having passed through the diffusion sheet 113 so that the light is incident upon the liquid crystal panel 120 as perpendicular thereto as possible.

As will be described below, a plurality of light emitting elements are arranged in a two-dimensional array below the primary surface 101a of the light emitting module 101, and the light emitting module 101 forms a direct backlight that emits white light. In the light emitting module 101, a plurality of light emitting elements are provided on a lightguide plate, and the lightguide plate is provided with a portion that functions as a lens for controlling the light distribution. Thus, the overall thickness of the light emitting module 101 is small.

First Embodiment

A first embodiment of a light emitting module of the present disclosure will now be described.

(Light Emitting Module 101)

Figure 2A:
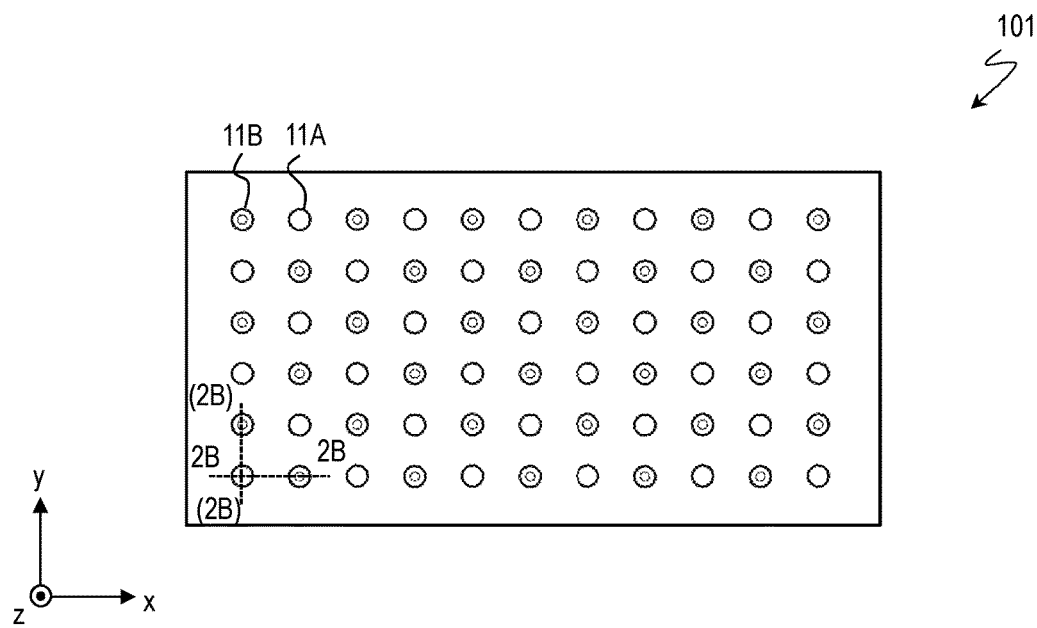
FIG. 2A is a schematic top view showing a light emitting module of the first embodiment of the present disclosure.
Figure 2B:
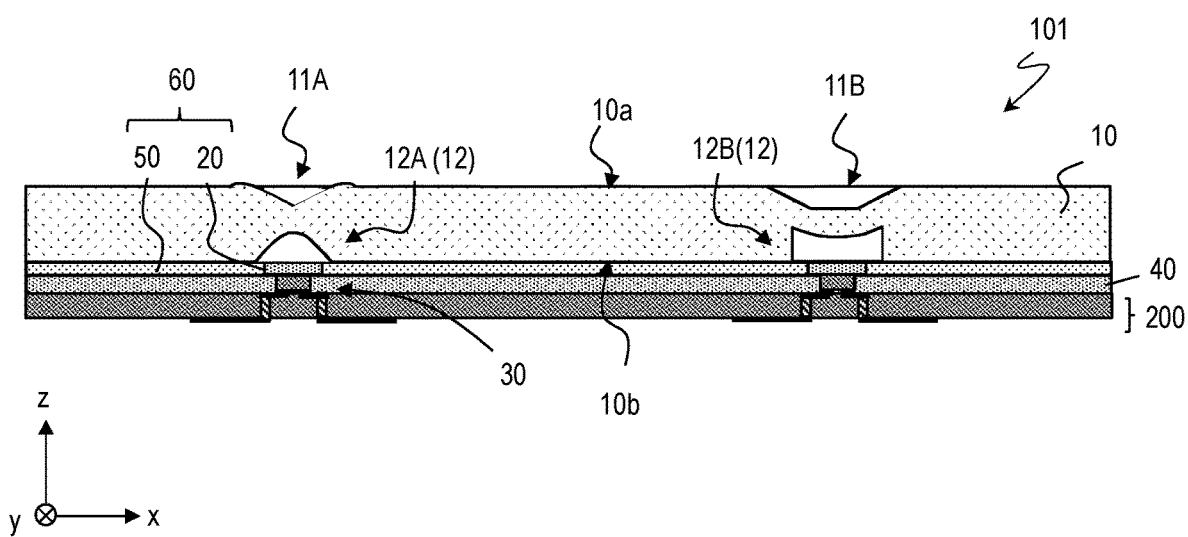
FIG. 2B is a schematic cross-sectional view of the light emitting module taken along line 2B-2B of FIG. 2A.
Figure 2C:
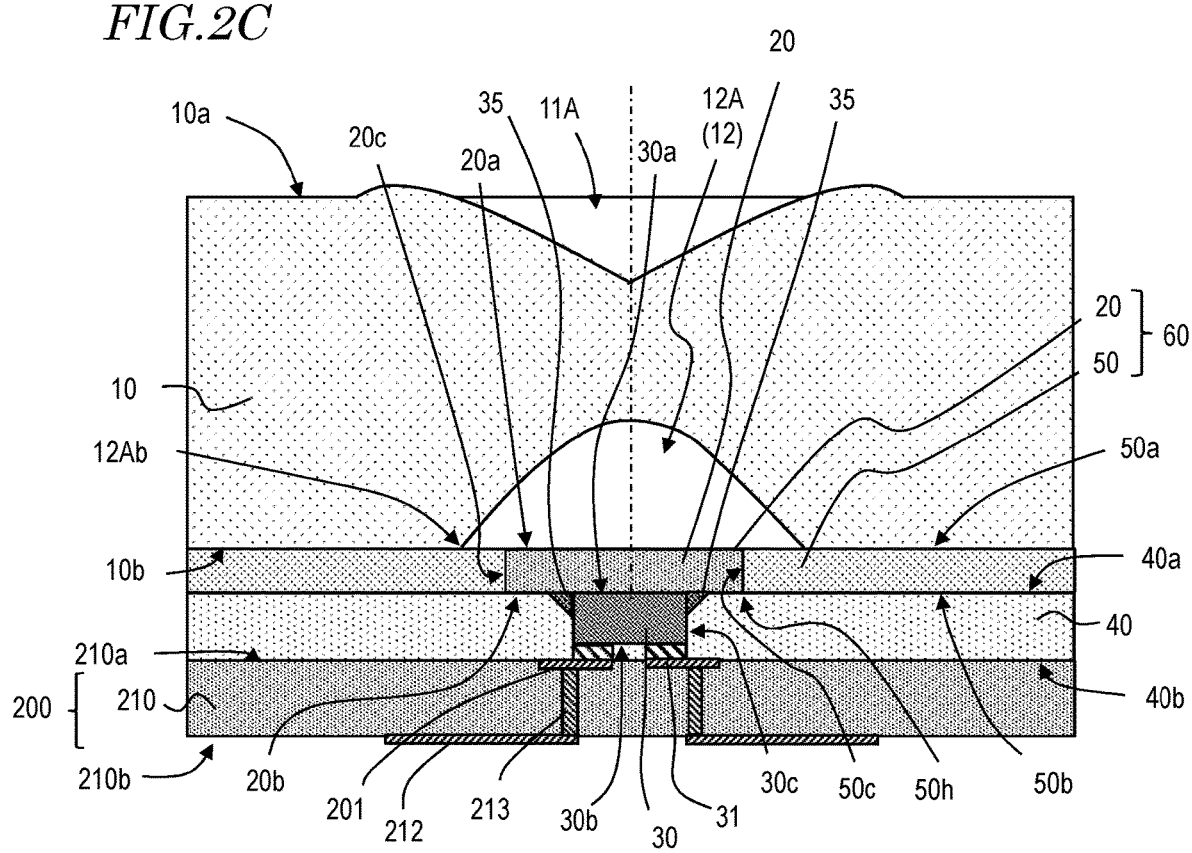
FIG. 2C is an enlarged schematic cross-sectional view showing a part of FIG. 2B.
Figure 2D:
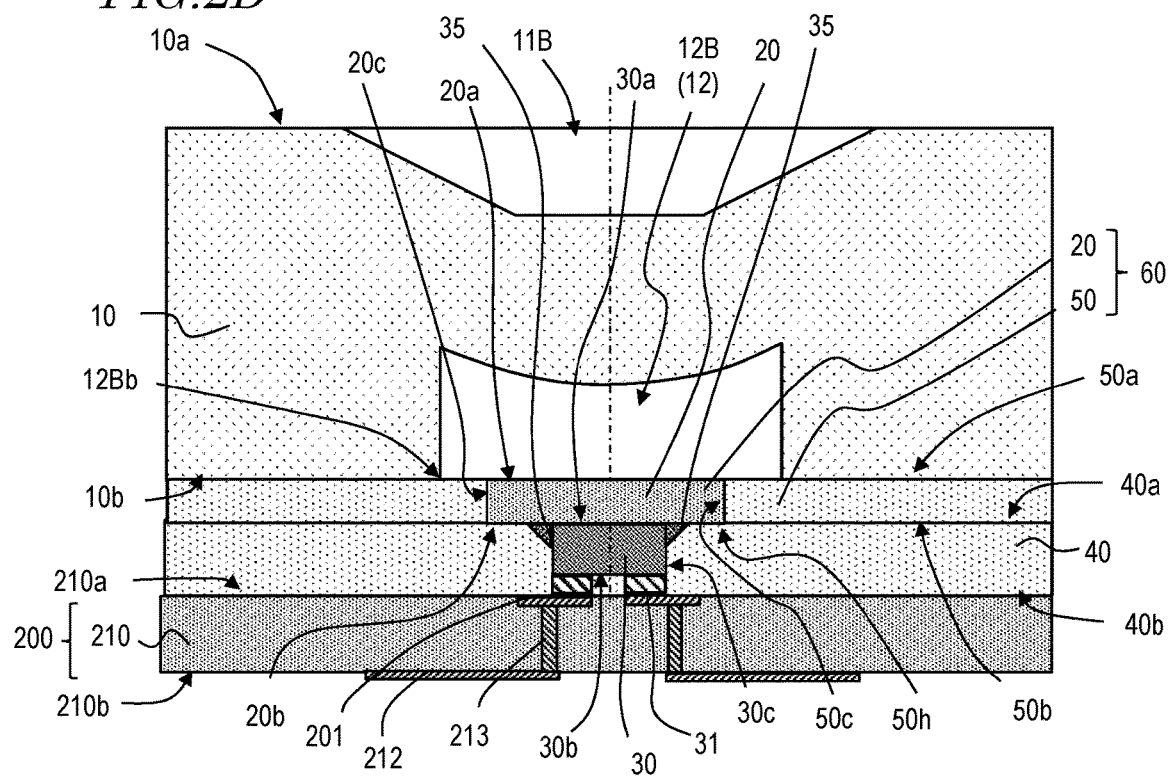
FIG. 2D is an enlarged schematic cross-sectional view showing another part of FIG. 2B.

The first embodiment of the light emitting module 101 will be described in detail. FIG. 2A is a schematic top view of the light emitting module 101, FIG. 2B is a schematic cross-sectional view of the light emitting module 101 taken along line 2B-2B of FIG. 2A, and FIG. 2C and FIG. 2D are enlarged schematic cross-sectional views showing a part of FIG. 2B. While line 2B-2B is parallel to the x axis, a cross section that is parallel to the y axis has the same structure. The light emitting module 101 includes the lightguide plate 10, a plurality of wavelength conversion members 20, a plurality of light emitting elements 30, and a resin member 50.

The light emitting element 30 has the primary light emitting surface 30a and the lateral surface 30c, and a plurality of wavelength conversion members 20 are arranged respectively on the primary light emitting surfaces 30a of the light emitting elements 30. The resin member 50 is arranged between the wavelength conversion members 20. In the present embodiment, the wavelength conversion members 20 and the resin member 50 together form a combined structure 60.

The lightguide plate 10 has the first primary surface 10a and the second primary surface 10b, and is arranged on the resin member 50 and the wavelength conversion members 20 so that the second primary surface 10b faces the resin member 50 and the wavelength conversion members 20. That is, the combined structure 60 is located so as to face the second primary surface 10b of the lightguide plate 10. The lightguide plate 10 includes a plurality of recessed portions 12 located on the second primary surface 10b. As will be described below, in the present embodiment, the recessed portions 12 include recessed portions 12A and recessed portions 12B, which have different cross-sectional shapes, and are located over the wavelength conversion members 20. The configuration of each section of the light emitting module 101 will now be described in detail.

[Lightguide Plate 10]

The lightguide plate 10 is a light-transmitting member that receives light from the light emitting element 30 and gives a planar light emission. The lightguide plate 10 of the present embodiment has the first primary surface 10a, which is the light emitting surface, and the second primary surface 10b located on the opposite side from the first primary surface 10a.

The first primary surface 10a may be flat, or may include an optical element arranged thereon that functions as an optical lens and has the light distributing function of adjusting the direction and the distribution of the emitted light. For example, as shown in FIG. 2A and FIG. 2B, in the present embodiment, the lightguide plate 10 has a plurality of optical function portions 11A and a plurality of optical function portions 11B that have different shapes from each other on the first primary surface 10a. The optical function portions 11A and 11B are arranged two-dimensionally in the x-axis direction and the y-axis direction on the first primary surface 10a. In the present embodiment, the optical function portions 11A and 11B are arranged two-dimensionally in a matrix pattern along the x-axis direction and the y-axis direction on the first primary surface 10a. The optical function portions 11A and the optical function portions 11B are arranged alternating with each other both in the direction and in the y direction. The arrangement of the optical function portions 11A and 11B in the present embodiment is merely an example, and there is no limitation on the arrangement of the optical function portions 11A and 11B. For example, either the optical function portions 11A or the optical function portions 11B may be arranged on the first primary surface 10a. When the optical function portions 11A and 11B are arranged on the first primary surface 10a, the ratio between the number of the optical function portions 11A and the number of the optical function portions 11B is not limited to 1:1 but may be any other ratio.

The optical function portions 11A and 11B have a shape of a recessed portion, a protruding portion, or a combination thereof, provided on the first primary surface 10a. By virtue of the shape thereof, the optical function portions 11A and 11B refract light passing therethrough to adjust the light distribution. In the present embodiment, the optical function portion 11A has a shape that is obtained by combining together a recessed portion of an inverted cone-shaped (a cone shape that has the bottom surface on the first primary surface 10a) and a ring-shaped protruding portion projecting from the first primary surface 10a along the opening of the recessed portion. The optical function portion 11B is a recessed portion that has an inverted truncated cone shape (a truncated cone shape that has the bottom surface on the first primary surface 10a).

It is preferred that the light emitting module 101 of the present disclosure can emit light, which is emitted from the light emitting elements 30, in a widespread emission in as short a distance as possible from the light emitting elements in order to realize a thin surface-emitting light source.

Therefore, it is preferred that each of the optical function portions 11A and 11B has an optical axis and has a depressed shape such that the opening on the first primary surface 10a is larger than that on the bottom portion. For example, it is preferred that the optical function portion 11A and the optical function portion 11B have an inverted polygonal pyramid such as an inverted cone shape, an inverted quadrangular pyramid shape or an inverted hexagonal pyramid shape. The recessed portion may be a void, which may be filled with air, for example, or with a material having a different refractive index than that of the material of the lightguide plate 10. The optical function portion 11A and the optical function portion 11B may further include a light-reflective member such as a metal or a white resin arranged in a portion of the shape.

Figure 2E:
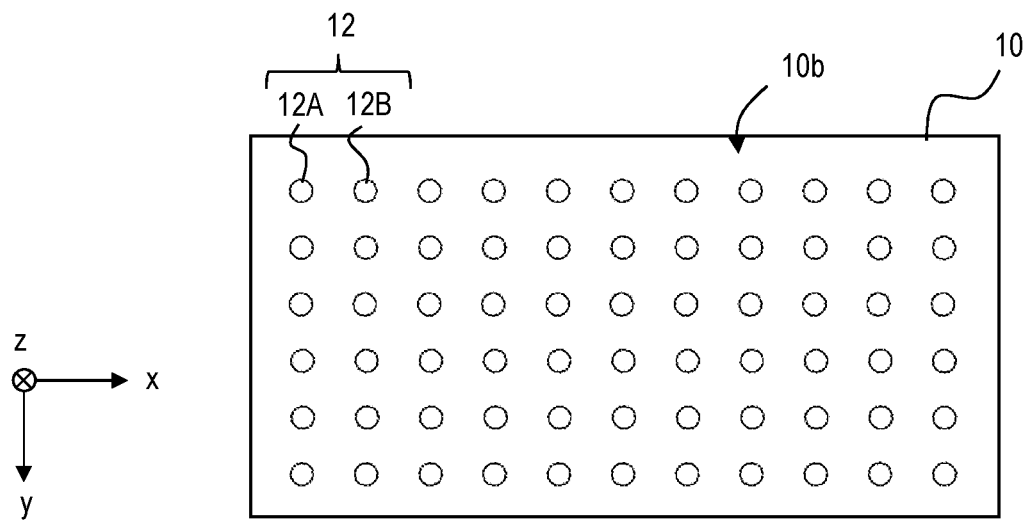
FIG. 2E is a schematic bottom view showing a lightguide plate.

FIG. 2E is a bottom view showing the lightguide plate 10. The lightguide plate 10 includes a plurality of recessed portions 12. The plurality of recessed portions 12 may include first recessed portions 12A and a plurality of second recessed portions 12B having different shapes on the second primary surface 10b. The first and second recessed portions 12A and 12B each function as an optical lens that adjusts the direction and distribution of light emitted from the wavelength conversion member 20. The first and second recessed portions 12A and 12B are arranged two-dimensionally in the x-axis direction and the y-axis direction on the second primary surface 10b. In the present embodiment, the recessed portions 12A and the recessed portions 12B are arranged two-dimensionally in a matrix pattern along the x-axis direction and the y-axis direction on the second primary surface 10b. The recessed portions 12A and the recessed portions 12B are arranged alternating with each other both in the x direction and in the y direction. The positions of the first and second recessed portions 12A and 12B correspond to the positions of the optical function portions 11A and 11B on the first primary surface 10a. More specifically, it is preferred that the optical axes of the recessed portions 12A and 12B arranged on the second primary surface 10b and the optical axes of the optical function portions 11A and 11B provided on the first primary surface 10a generally coincide with each other.

The shape of the openings 12Ab and 12Bb of the recessed portion 12A and the recessed portion 12B as seen from the second primary surface 10b may be generally rectangular or generally circular, for example. Where the arrangement pitch of the recessed portions 12A and the recessed portions 12B is generally the same in the x direction and in the y direction, it is preferred that the planar shape is a generally circular shape or a generally square shape. Then, the distribution of light emitted from the wavelength conversion member 20 can be made uniform for the two directions, and it is possible to suppress the unevenness of light emitted from the lightguide plate 10.

In the present embodiment, the recessed portion 12A has an inverted cone shape with a rounded apex as seen from the second primary surface 10b side. That is, the bottom of the recessed portion 12A has a shape that is protruding toward the first primary surface 10a side of the lightguide plate 10. The recessed portion 12B has a cylindrical shape whose bottom portion has a curved surface that is protruding toward the recessed portion side as seen from the second primary surface 10b side. That is, the bottom portion of the recessed portion 12B has a shape that is protruding toward the second primary surface 10b side of the lightguide plate 10.

The wavelength conversion member 20 is arranged facing the openings 12Ab and 12Bb of the recessed portions 12A and 12B. The recessed portions 12A and 12B may each be a void, which may be filled with a gas such as air. With the lightguide plate 10 having such a structure, light emitted from the wavelength conversion member 20 enters the inside of the lightguide plate 10 from the recessed portions 12A and 12B. Then, since light travels from a low-refractive index region, which is a gas such as air, to a high-refractive index region, which is the lightguide plate 10, total reflection does not occur at the interface therebetween. Therefore, light emitted from the wavelength conversion member 20 can enter the inside of the lightguide plate 10 with a high efficiency.

For example, the size of the optical function portions 11A and 11B and the recessed portions 12A and 12B in a plan view is about 0.05 mm or more and about 10 mm or less, preferably about 0.1 mm or more and about 1 mm or less. The depth is about 0.05 mm or more and about 4 mm or less, preferably about 0.1 mm or more and about 1 mm or less. There is no particular limitation on the bottom portions of the optical function portions 11A and the optical function portions 11B and the bottom portions of the recessed portions 12A and the recessed portions 12B as long as they are spaced apart from each other. Note that "in a plan view" means to be seen in a direction perpendicular to the first primary surface 10a or the second primary surface 10b. The size of a shape is defined by the diameter of a circumcircle of the shape in a plan view.

The arrangement pitch of the optical function portions 11A and 11B is equal to the arrangement pitch of the light emitting element 30, e.g., about 0.05 mm or more and about 20 mm or less, preferably about 1 mm or more and about 10 mm or less.

For example, the size of the lightguide plate 10 is about 1 cm or more and about 200 cm or less each side, preferably about 3 cm or more and about 30 cm or less each side. The thickness of the lightguide plate 10 is about 0.1 mm or more and about 5 mm or less, and preferably about 0.5 mm or more and about 3 mm or less. The lightguide plate 10 may have any of various planar shapes depending on the application. The lightguide plate 10 may have a polygonal shape such as a generally rectangular shape or a generally circular shape, for example.

The material of the lightguide plate 10 may be a resin material such as a thermoplastic resin such as acrylic, polycarbonate, cyclic polyolefin, polyethylene terephthalate and polyester or a thermosetting resin such as epoxy and silicone, or an optically transparent material such as glass. A thermoplastic resin material is particularly preferred because it can be manufactured efficiently by injection molding. Among others, polycarbonate, which is highly transparent and inexpensive, is preferred. When a light emitting device is manufactured by attaching an interconnect substrate after mounting the light emitting elements 30 on the lightguide plate 10, as will be described below, it is possible to omit a step such as solder reflow in which a high temperature is used can be omitted, making it possible to use even a material that is thermoplastic and has a low heat resistance such as polycarbonate.

The lightguide plate 10 can be formed by injection molding, transfer molding, thermal transfer, or the like, for example. It is preferred that the optical function portions 11A and 11B arranged on the first primary surface 10a of the lightguide plate 10 and the recessed portions 12A and 12B arranged on the second primary surface 10b are also formed integrally using a mold. Thus, it is possible to reduce the molding misalignment between the optical function portions 11A and 11B and the recessed portions 12A and 12B.

The lightguide plate 10 may be a single layer, or may include a plurality of light-transmitting layers that are layered together. When a plurality of light-transmitting layers are layered together, a layer having a different refractive index, e.g., an air layer, or the like, may be provided between any layers. Then, light can be diffused more easily, and it is possible to realize a light emitting module with reduced unevenness in luminance. Such a configuration can be realized by providing spacers between any light-transmitting layers, thereby spacing them apart and providing an air layer therebetween.

A light-transmitting layer may be provided on the first primary surface 10a and the second primary surface 10b of the lightguide plate 10 with spacers, or the like, interposed therebetween. Then, an air layer is formed between the lightguide plate 10 and the light-transmitting layer, and it is possible to better diffuse light. Therefore, it is possible to reduce the unevenness in luminance of light emitted from the light emitting module 101.

[Wavelength Conversion Member 20]

The wavelength conversion member 20 converts the wavelength of a portion of light emitted from the light emitting element 30. The wavelength conversion member 20 has the first primary surface 20a, the second primary surface 20b and the lateral surface 20c, wherein the lateral surface 20c is covered by the resin member 50 arranged between the wavelength conversion members 20. The first primary surfaces 20a of the wavelength conversion members 20 are arranged so as to be in contact with the voids of the recessed portions 12A and 12B. In other words, the first primary surfaces 20a of the wavelength conversion members 20 are exposed in the voids of the recessed portions 12A and 12B.

It is preferred that the wavelength conversion member 20 is larger than the primary light emitting surface 30a of the light emitting element 30 in a plan view. Then, light emitted from the light emitting element 30 can efficiently enter the wavelength conversion member 20 for the wavelength conversion of the emitted light. There is no limitation on the size of the wavelength conversion member 20 in a plan view, and it may be larger or smaller than the recessed portion 12A, 12B. In view of the cost, since the wavelength conversion member 20 is a relatively expensive member, it is preferably small. Therefore, it is preferred that the wavelength conversion member 20 is smaller than the opening 12Ab, 12Bb of the recessed portion 12A, 12B.

The wavelength conversion member 20 has a polygonal shape such as a rectangular shape or a circular shape in a plan view. In the present embodiment, the wavelength conversion member 20 has a square shape in a plan view. As will be described below, the wavelength conversion members 20 are arranged so that each side thereof is parallel to the x axis or the y axis in a plan view.

The wavelength conversion member 20 may be a plate-shaped molded product, or may be obtained by curing a material (hereinafter referred to as an uncured material) that has such a hardness that it can be thermoplastically processed at room temperature. As will be described below, the wavelength conversion member 20, together with the resin member 50, forms the combined structure 60.

For example, the matrix of the wavelength conversion member 20 may comprise or be composed of an epoxy resin, a silicone resin, a mixed resin thereof, or a light-transmitting material such as glass. In view of the lightfastness and the moldability, it is preferred to select a silicone resin as the matrix of the wavelength conversion member 20. It is preferred that the matrix of the wavelength conversion member 20 is a material having a higher refractive index than the material of the lightguide plate 10.

The wavelength conversion member 20 includes, as the wavelength conversion substance, a fluoride-based phosphor such as a YAG phosphor, a β-SiAlON phosphor or a KSF-based phosphor. Particularly, it is preferred that the wavelength conversion member 20 includes a plurality of types of wavelength conversion substances. For example, it is preferred that the wavelength conversion member 20 includes a β-SiAlON phosphor that emits light of greenish color and a fluoride-based phosphor such as a KSF-based phosphor that emits light of reddish color. Then, it is possible to obtain the light emitting module 101 capable of surface emitting light of whitish color. By using such a light emitting module 101, it is possible to expand the color reproduction range of the liquid crystal display device 1000. For example, when using the light emitting element 30 that emits light of bluish color, for example, the wavelength conversion member 20 may include 60 wt % or more, preferably 90 wt % or more, of a KSF-based phosphor (red phosphor) so as to obtain light of reddish color. That is, the wavelength conversion member 20 may include a wavelength conversion substance that emits light of a particular color so that light of the particular color is emitted. The wavelength conversion substance is not limited to a phosphor, but may be a quantum dot phosphor, or the like.

The wavelength conversion substance may be arranged in any manner inside the wavelength conversion member 20. For example, the wavelength conversion substance may be distributed generally evenly, or unevenly, inside the wavelength conversion member 20. For example, "distributed unevenly" means that the wavelength conversion substance is arranged so that the concentration is higher on the first surface 20a side or the second surface 20b side of the wavelength conversion member 20. Alternatively, it means that the wavelength conversion substance is arranged so that the concentration is higher near the center or near the periphery in a plan view. The wavelength conversion member may include a plurality of layers, each including a wavelength conversion substance, that are layered together.

The wavelength conversion member 20 may include a material other than a wavelength conversion substance. For example, the wavelength conversion member 20 may include a diffuser. Specifically, the wavelength conversion member 20 may include fine particles of $SiO_2$, $TiO_2$, or the like, as a diffuser.

[Resin Member 50]

The resin member 50 supports the wavelength conversion members 20, and arranges the wavelength conversion members 20 at predetermined positions relative to the recessed portions 12A and 12B provided on the second primary surface 10b of the lightguide plate 10. Particularly, with the light emitting module 101, the recessed portions 12A and 12B may be voids, and the resin member 50 has the function of holding the wavelength conversion members 20 in contact with the voids at the time of manufacture.

Figure 2F:
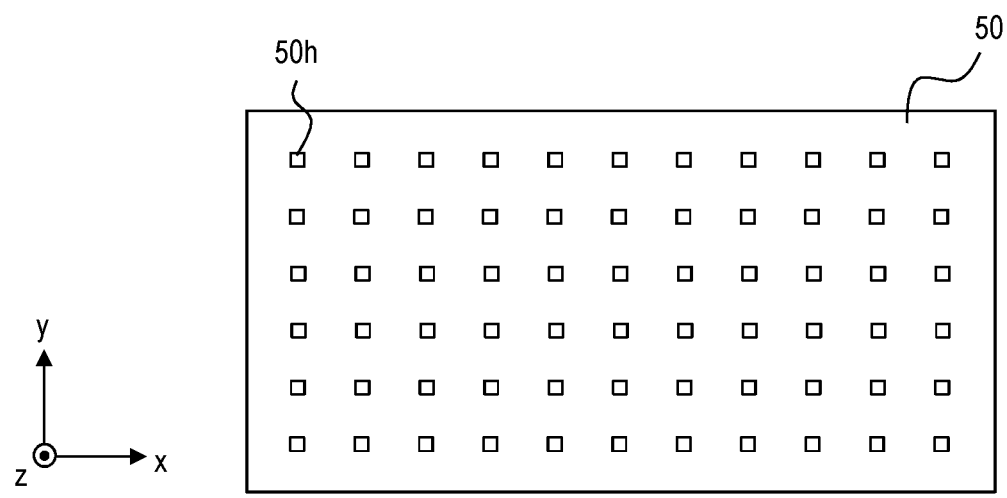
FIG. 2F is a schematic top view showing a resin member.

The resin member 50 is a light-transmitting or light-reflective plate-shaped member. FIG. 2F is a schematic plan view of the resin member 50. The resin member 50 has a plurality of through holes 50h each having openings on the two primary surfaces. The through holes 50h are arranged two-dimensionally at a pitch that corresponds to the arrangement pitch of the recessed portions 12A and 12B provided on the second primary surface 20b of the lightguide plate 10.

Figure 2G:
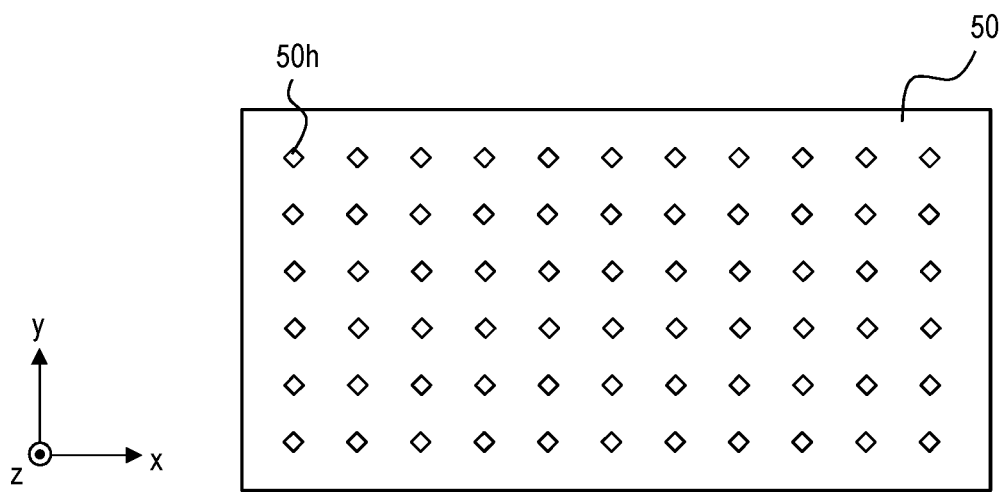
FIG. 2G is a schematic top view showing another embodiment of a resin member.

The wavelength conversion members 20 are arranged in the through holes 50h, thereby forming the combined structure 60. The shape of the through hole 50h in a plan view coincides with the shape of the wavelength conversion member 20 in a plan view. The thickness of the resin member is generally equal to the thickness of the wavelength conversion member 20. In the present embodiment, since the wavelength conversion member 20 has a square shape in a plan view, the through hole 50h also has a square shape in a plan view. As shown in FIG. 2F, each side of the square-shaped through hole 50h may be parallel to the x axis or the y axis in a plan view, i.e., on the yx plane. However, as shown in FIG. 2G, each side of the square-shaped through hole 50h may be at an angle of 45° relative to the x axis and the y axis.

As shown in FIG. 2C and FIG. 2D, a lateral surface 50c of the through hole 50h may be a surface that is perpendicular to a first primary surface 50a and/or a second primary surface 50b. Alternatively, the lateral surface 50c of the through hole 50h may be a slope that forms an angle other than 90° relative to the first primary surface 50a and/or the second primary surface 50b. The lateral surface 50c may be provided with a step. When the lateral surface 50c is sloped or stepped, the opening of the through hole 50h on the first primary surface 50a may be larger or smaller than the opening on the second primary surface 50b. As the lateral surface 50c is sloped or stepped, it is possible to increase the contact area between the lateral surface 20c of the wavelength conversion member 20 and the lateral surface 50c of the resin member 50 and to increase the adhesion between the wavelength conversion member 20 and the resin member 50, thereby preventing the wavelength conversion member 20 from coming off.

Where the resin member 50 is formed from a light-transmitting plate-shaped member, as light emitted from the lateral surface 20c of the wavelength conversion member 20 passes through the resin member 50, light emitted from the light emitting element 30 can enter the lightguide plate 10 by being incident upon the second primary surface 10b side of the lightguide plate 10 at a wider angle. On the other hand, where the resin member 50 is formed from a light-reflective plate-shaped member, light emitted from the lateral surface 20c of the wavelength conversion member 20 is reflected toward the wavelength conversion member 20 side, and it is possible to increase the amount of light emitted from the first primary surface 20a of the wavelength conversion member 20.

Where the resin member 50 is formed from a light-transmitting plate-shaped member, the resin member 50 can be formed from a light-transmitting material that can be used for the lightguide plate 10 described above. The resin member 50 may be formed from the same material as, or a different material from, the lightguide plate 10.

Where the resin member 50 is formed from a light-reflective plate-shaped member, a resin containing a white pigment, or the like, may be used for the wavelength conversion member 20. For example, a silicone resin containing titanium oxide as a white pigment may be used as the material of the resin member 50. In such a case, the resin member 50 has a reflectivity of 60% or more, preferably a reflectivity of 90% or more, for light emitted from the light emitting element 30.

The resin member 50 can be molded by injection molding, transfer molding, thermal transfer, or the like. Alternatively, the resin member 50 may be produced by forming a plurality of through holes 50h in a plate-shaped member by a laser process, or the like.

The combined structure 60 can be obtained by inserting the plate-shaped wavelength conversion members 20 in the through holes 50h of the resin member 50. In this process, the wavelength conversion members 20 may be secured to the resin member 50 by an adhesive, or the like. Alternatively, the process may include arranging the resin member 50 on a flat support, filling the through holes 50h with an uncured material of the wavelength conversion members 20, removing an excess material with a squeegee, or the like, and then allowing the material of the wavelength conversion members 20 to cure.

The combined structure 60 is attached to the second primary surface of the lightguide plate 10 by an adhesive, or the like, with the wavelength conversion members 20 aligned so as to be in contact with the recessed portions 12A and 12B.

[Light Emitting Element 30]

The light emitting element 30 is a light source of the light emitting module 101. The light emitting module 101 includes a plurality of light emitting elements 30, and the light emitting elements 30 are attached to one lightguide plate 10 with the wavelength conversion members 20 interposed therebetween.

The light emitting element 30 includes a semiconductor layered structure and a pair of electrodes 31, wherein the semiconductor layered structure includes the primary light emitting surface 30a from which light emission is primarily extracted, an electrode formation surface 30b located on the opposite side from the primary light emitting surface 30a, the lateral surface 30c located between the primary light emitting surface 30a and the electrode formation surface 30b, and the electrodes 31 are located on the electrode formation surface 30b. The electrodes 31 are electrically connected to an interconnect substrate 200 to be described later. The primary light emitting surface 30a of the light emitting element 30 is attached to the wavelength conversion member 20 with a light-transmitting attachment member 35 such as a light-transmitting resin interposed therebetween.

The light emitting element 30 includes a light-transmitting substrate of sapphire, or the like, and a semiconductor layer layered on the light-transmitting substrate, for example. The semiconductor layered structure includes a light emitting layer, and an n-type semiconductor layer and a p-type semiconductor layer with the light emitting layer sandwiched therebetween, wherein the electrodes 31 are electrically connected to the n-type semiconductor layer and the p-type semiconductor layer. It is preferred that the light emitting layer is formed from a nitride semiconductor $(In_xAl_yGa_{1-x-y}N, 0 \leq X, 0 \leq Y, X+Y \leq 1)$ capable of emitting light of a short wavelength with which it is possible to efficiently excite the wavelength conversion substance of the wavelength conversion member 20.

There is no particular limitation on the size of the light emitting element 30. The size of the light emitting element 30 along the x and y directions in a plan view is 1000 μm or less, for example. The size along the x and y directions is preferably 500 μm or less, more preferably 200 μm or less. Using the light emitting element 30 of such a size, when an image is displayed on the liquid crystal display device 1000 by partially driving the light emitting module 101, it is possible to produce bright-dark contrast by smaller units, thereby realizing an image of a higher definition. When the light emitting element 30 whose size along the x and y directions is 500 μm or less is used, it is possible to procure the light emitting element 30 at low cost, and it is therefore possible to make the light emitting module 101 inexpensive. Note that with a light emitting element of which the size along the x direction and the size along the y direction are both 250 μm or less, the area of the upper surface of the light emitting element is small, thereby relatively increasing the amount of light emission from the lateral surface 30c of the light emitting element 30. That is, such a light emitting element 30, which has a batwing-shaped light distribution characteristic, can suitably be used in the light emitting module 101 of the present embodiment, where the distance between the lightguide plate 10 and the light emitting elements 30 is short.

The light emitting element 30 has a polygonal shape such as a rectangular shape in a plan view. It is preferred that the light emitting elements 30 are arranged so that the sides of the wavelength conversion members 20 are parallel to the sides of the light emitting elements 30 in a plan view. For example, the light emitting elements 30 each have a square shape or a rectangular shape in a plan view. Where a large number of light emitting elements 30 are attached to the wavelength conversion members 20, if the shape of the light emitting element 30 in a plan view is a rectangular shape, it is easy to visually find rotationally-misaligned light emitting elements 30. On the other hand, if the shape of the light emitting element 30 in a plan view is a square shape, the mass productivity of the light emitting elements 30 is high. Moreover, the pitch in the x direction and the pitch in the y direction can be made equal to each other.

The arrangement of the light emitting elements 30 is dependent on the positions of the recessed portions 12A and the recessed portions 12B provided on the second primary surface 10b of the lightguide plate 10. Specifically, they are arranged so that the optical axes of the light emitting element 30 coincide with the optical axes of the recessed portions 12A and 12B. That is, the light emitting elements 30 are arranged two-dimensionally in the x-axis direction and the y-axis direction on the second primary surface 10b.

[Light-Transmitting Attachment Member 35]

As shown in FIG. 2C and FIG. 2D, the primary light emitting surface 30a of the light emitting element 30 may be attached to the wavelength conversion member 20 by the light-transmitting attachment member 35. The light-transmitting attachment member 35 allows 60% or more, preferably 90% or more, of light emitted from the light emitting element 30 to pass therethrough. The light-transmitting attachment member 35 serves to propagate light emitted from the light emitting element 30 to the wavelength conversion member 20. Therefore, the light-transmitting attachment member 35 may possibly include a diffuser member, or the like, and it may be formed only of a light-transmitting resin material that does not include a diffuser member, or the like.

The light-transmitting attachment member 35 may cover the lateral surface 30c of the light emitting element 30. Moreover, it is preferred to cover the lateral surface of the light emitting layer of the light emitting element 30. Thus, it is possible to increase the light extraction efficiency of the light emitting module 101 by efficiently extracting light emitted in the direction of the lateral surface of the light emitting element 30 into the light-transmitting attachment member 35 so that the light enters the wavelength conversion member 20. When the light-transmitting attachment member 35 covers the lateral surface 30c of the light emitting element 30, it is preferred that a portion of the light-transmitting attachment member 35 that covers the lateral surface 30c is also in contact with the wavelength conversion member 20, and it is preferred that it has a shape that flares toward the direction of the wavelength conversion member 20. Thus, light emitted in the direction of the lateral surface 30c of the light emitting element 30 can efficiently enter the lightguide plate 10.

The material of the light-transmitting attachment member 35 may be a light-transmitting thermosetting resin material such as an epoxy resin or a silicone resin.

[Encapsulation Member 40]

The light emitting module 101 may include an encapsulation member 40 that covers and encapsulates the lateral surfaces 30c of the light emitting elements 30, the resin member 50 and the wavelength conversion members 20. Thus, it is possible to protect the light emitting elements 30 and the wavelength conversion members 20 and to increase the structure strength of the second primary surface 10b side of the lightguide plate 10, thereby increasing the overall strength of the light emitting module 101. Where the light-transmitting attachment member 35 is arranged on the lateral surface 30c of the light emitting element 30, it is preferred that the encapsulation member 40 also covers the light-transmitting attachment member 35. The electrode 31 of the light emitting element 30 is exposed from the encapsulation member 40. The encapsulation member 40 has a layered shape including a first primary surface 40a in contact with the resin member 50 and a second primary surface 40b located on the opposite side.

The light-reflective member used as the encapsulation member 40 has a reflectivity of 60% or more, preferably a reflectivity of 90% or more, for light emitted from the light emitting element 30.

It is preferred that the light-reflective member is a resin that contains a white pigment, or the like. Particularly, it is preferred to use a silicone resin that contains titanium oxide. Since the encapsulation member 40 needs to widely cover the lightguide plate 10, using an inexpensive substance such as titanium oxide, it is possible to reduce the manufacturing cost of the light emitting module 101.

[Interconnect 201]

For the electrical connection with the outside or the connection with the interconnect substrate 200, the light emitting module 101 may include interconnects 201 that are electrically connected to the electrodes 31 of the light emitting elements 30. The interconnects 201 may be formed on the second primary surface 40b of the encapsulation member 40. With the provision of the interconnects 201, the light emitting elements 30 can be electrically connected to each other, for example, and it is possible to form a circuit that is necessary when partially driving the light emitting module.

The interconnects 201 are formed from a conductive material such as a metal, and can be formed by using a thin film formation technique and a patterning technique, for example.

[Interconnect Substrate 200]

The light emitting module 101 may include the interconnect substrate 200. Since the interconnect substrate 200 can be provided in advance with an interconnect pattern thereon, the light emitting module 101 can include more complicated interconnects that are necessary for partial driving, etc., by including the interconnect substrate 200.

The interconnect substrate 200 may be any of interconnect substrates of various forms that are used for mounting semiconductor devices, etc. For example, the interconnect substrate 200 includes a plate-shaped or sheet-shaped base 210. The base 210 includes a first primary surface 210a and a second primary surface 210b, and an interconnect layer 212 is provided on the second primary surface 210b. A through hole extends from the first primary surface 210a to reach the interconnect layer 212 on the second primary surface 210b, and the through hole is filled with a conductive member 213. The conductive member 213 is exposed on the first primary surface 210a.

The base 210 is attached to the encapsulation member 40 with the first primary surface 210a opposing a surface 40b of the encapsulation member 40 so that the conductive member 213 is electrically connected to the electrode 31 of the light emitting element 30 or the interconnect 201. Since the interconnect 201 can be made larger than the electrode 31 of the light emitting element 30, the provision of the interconnect 201 increases the alignment tolerance and facilitates the attachment of the interconnect substrate 200.

The base 210 may be a ceramic or a resin, for example. In view of the low cost and moldability, a resin may be selected as the material of the base 210. The resin may be a composite material such as phenolic resin, epoxy resin, polyimide resin, BT resin, polyphthalamide (PPA), polyethylene terephthalate (PET), unsaturated polyester, glass epoxy, etc. It may be a rigid substrate or a flexible substrate. With the light emitting module 101, the light emitting element 30 is attached to the wavelength conversion member 20 secured on the lightguide plate 10. In other words, the light emitting element 30 is supported on the lightguide plate 10. Therefore, the interconnect substrate 200 does not need to have the function of supporting the light emitting element 30, and the base 210 may be of a material that is inexpensive and thermally deformable such as glass epoxy or a sheet material that is thin and deformable.

The material of the interconnect layer 212 may be any of various materials that are conductive. It is preferred that the interconnect layer 212 has a high thermal conductivity. For example, it may be a conductive material such as copper. The interconnect layer 212 may be formed by plating or conductive paste application or printing, etc. The thickness of the interconnect layer 212 is about 5 to 50 μm, for example.

The interconnect substrate 200 may be attached to the lightguide plate 10, etc., by any method. For example, the attachment can be achieved by arranging and pressure-bonding a sheet-shaped adhesive sheet between the second primary surface 40b of the encapsulation member 40 and a first primary surface 200a of the interconnect substrate 200. The electric connection between the conductive member 213 and the electrode 31 of the light emitting element 30 or the interconnect 201 can be made by any method. For example, the conductive member 213 can be melted using pressure and heat so as to be attached to the interconnect 201.

Note that the interconnect substrate 200 may have a layered structure. For example, the interconnect substrate 200 may be a metal plate with an insulative layer provided on the surface thereof. The interconnect substrate 200 may include active parts such as TFTs (Thin-Film Transistors) and passive parts such as capacitors and resistors, and mounted on the interconnect layer 212 of the second primary surface 210b.

[Characteristic of Light Emitting Module]

With the light emitting module 101, the wavelength conversion member 20, to which the light emitting element 30 is connected, is arranged in contact with the space of the recessed portion 12 of the lightguide plate 10 without another member, such as a lens, interposed therebetween, and it is therefore possible to reduce the overall thickness of the light emitting module 101. When the resin member 50 covering the lateral surface of the wavelength conversion member 20 is light-transmitting, light emitted from the lateral surface of the wavelength conversion member 20 can also enter the lightguide plate 10 via the resin member 50 therebetween, and be extracted. When the resin member 50 covering the lateral surface of the wavelength conversion member 20 is light-reflective, by using the resin member 50, it is possible to suppress light emission from the lateral surface of the wavelength conversion member 20 and to increase the amount of light emitted to the recessed portion 12.

In the lightguide plate 10, while light emitted from the light emitting element 30 passes through the wavelength conversion member 20, a portion of the passing light is converted to light of a different wavelength, and is emitted into the recessed portion 12. At this point, light is refracted at the interface between the recessed portion 12 and the lightguide plate 10, and the recessed portion 12 functions as an optical lens that changes the light transmission direction by diverging and converging light passing through the interface. Therefore, the light distribution is adjusted by the recessed portion 12, and it is possible to adjust the light distribution even if the distance from the light emitting element to the first primary surface, which is the emission surface of the light emitting module 101, thereby realizing a thin backlight.

Particularly, as the recessed portion 12 is a void, light emitted from the light emitting element 30 passes through a region of a high refractive index from a region of a low refractive index when entering the lightguide plate 10 from the recessed portion 12. Therefore, no total reflection occurs at the interface between the recessed portion 12 and the lightguide plate 10, and it is possible to improve the light extraction efficiency of the light emitting module 101.

With the lightguide plate 10 including the recessed portions 12 and the optical function portions 11A and 11B, which function as optical lenses, light emitted from the light emitting element 30 can be adjusted through two optical lenses, and it is possible to emit light having a light distribution that is suitable for backlight by adjusting the light emission direction within a shorter distance. With the light emitting module 101 of the present embodiment, the thickness of the light emitting module 101 can be set to 5 mm or less, 3 mm or less, 1 mm or less, for example.

(Method for Manufacturing Light Emitting Module 101)

Referring to FIG. 3A to FIG. 3G, an example of a method for manufacturing a light emitting module of the present embodiment will now be described.

Figure 3A:
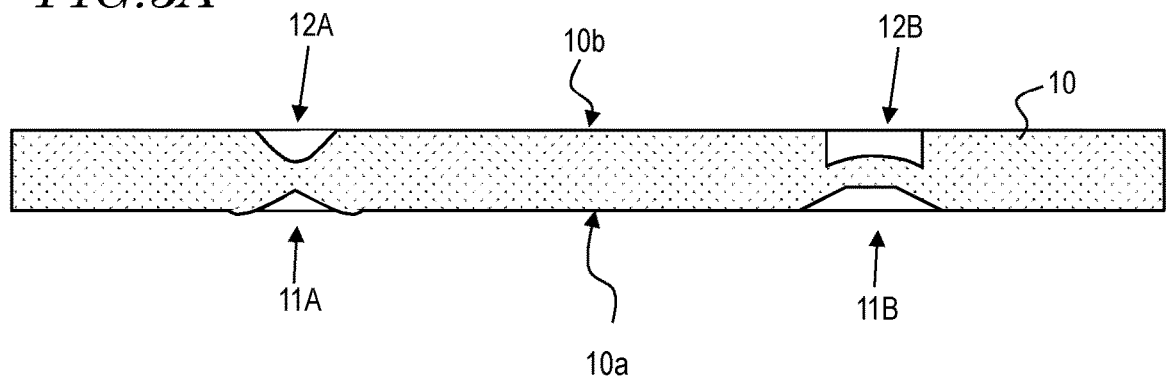
FIG. 3A is a schematic cross-sectional view showing a step in a method for manufacturing a light emitting module of the first embodiment of the present disclosure.

First, as shown in FIG. 3A, the lightguide plate 10 having the first primary surface 10a and the second primary surface 10b and including a plurality of recessed portions 12A and 12B located on the second primary surface 10b is provided. For example, the lightguide plate 10 made of polycarbonate is provided by injection molding, with a plurality of optical function portions 11A and 11B provided on the first primary surface 10a and a plurality of recessed portions 12A and 12B provided on the second primary surface 10b.

Figure 3B:
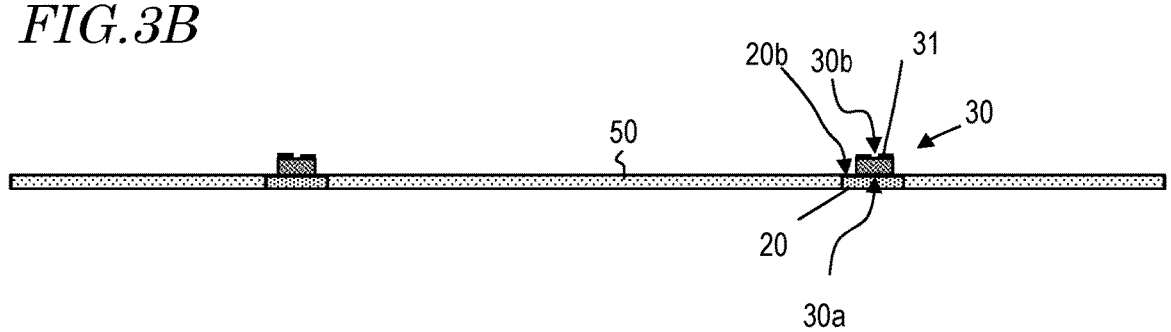
FIG. 3B is a schematic cross-sectional view showing a step in a method for manufacturing a light emitting module of the first embodiment of the present disclosure.

As shown in FIG. 3B, the combined structure 60 is produced. First, the resin member 50 having a plurality of through holes 50h therein is provided, and plate-shaped wavelength conversion members 20 are inserted into the through holes 50h, thereby obtaining the combined structure 60. Alternatively, the process includes arranging the resin member 50 on a flat support, filling the through holes 50h with an uncured material of the wavelength conversion members 20, removing an excess material with a squeegee, or the like, and then allowing the material of the wavelength conversion members 20 to cure. Thus, the combined structure 60 is obtained, which includes the resin member 50 arranged between the wavelength conversion members 20 so as to cover the lateral surfaces 20c thereof. Alternatively, the combined structure 60 can be formed by arranging a plurality of individual pieces of the wavelength conversion members 20 with regular intervals therebetween on a flat base, for example, and forming the resin member 50 so as to fill the gaps between the wavelength conversion members 20. With either one of the production methods described above, it is possible to obtain the plate-shaped combined structure 60 with the wavelength conversion members 20 exposed on both surfaces of the combined structure 60.

Then, the light emitting elements 30 are attached respectively to the wavelength conversion members 20 of the combined structure 60 so that the primary light emitting surfaces 30a face the wavelength conversion members 20. Specifically, the light emitting elements 30 are arranged on the wavelength conversion members 20 so that the primary light emitting surfaces 30a face the wavelength conversion members 20 with the material 35' of the light-transmitting attachment member interposed therebetween, and the material 35' of the light-transmitting attachment member is allowed to cure, thereby obtaining the light-transmitting attachment member 35. At this point, the lateral surface 30c of the light emitting element 30 may be covered by the material of the light-transmitting attachment member 35. Since the primary light emitting surface 30a faces the wavelength conversion member 20, the electrode formation surface 30b, on which the electrode 31 is provided, faces up. The light emitting elements 30 may be attached to the wavelength conversion members 20 after the combined structure 60 is attached to the lightguide plate 10.

Figure 3C:
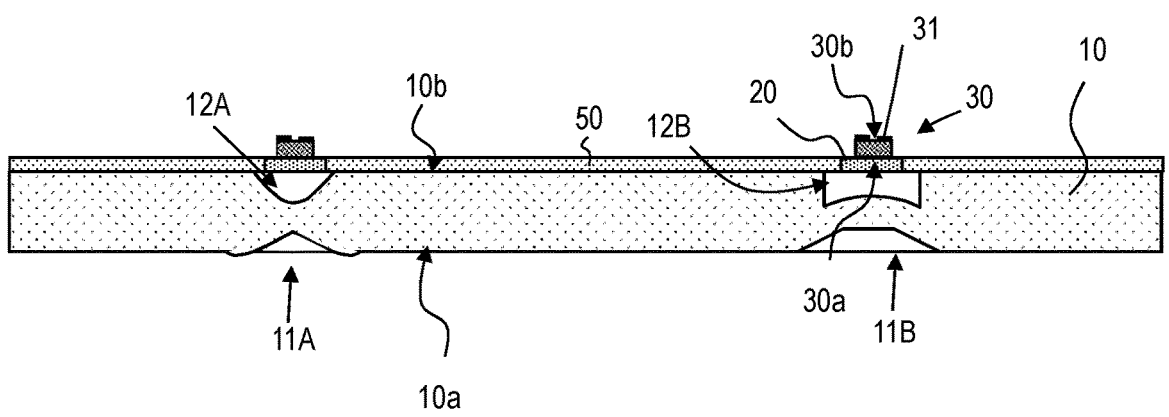
FIG. 3C is a schematic cross-sectional view showing a step in a method for manufacturing a light emitting module of the first embodiment of the present disclosure.

As shown in FIG. 3C, the combined structure 60, with which the light emitting elements 30 attached thereto, is attached to the second primary surface 10b of the lightguide plate 10 using an adhesive, or the like. At this point, the combined structure 60 is aligned relative to the lightguide plate 10 so that the wavelength conversion members 20 are located at the openings of the recessed portions 12A and 12B.

Figure 3D:
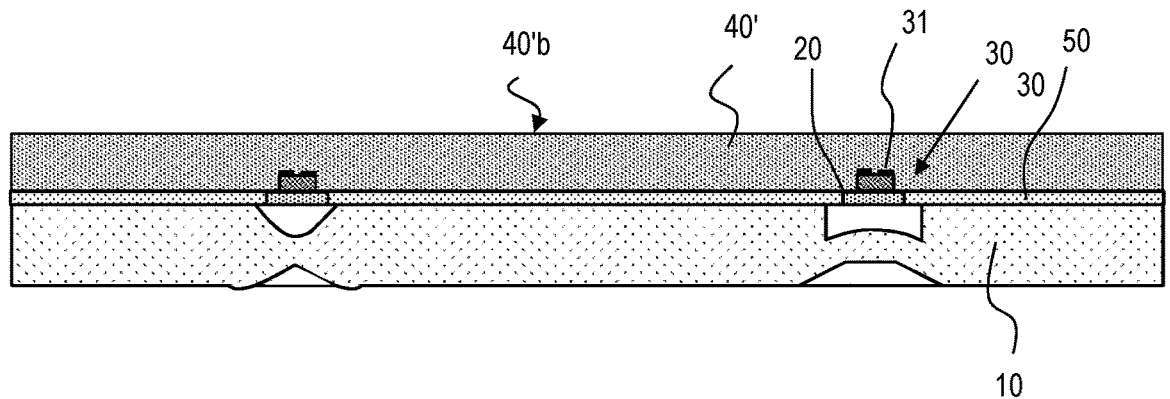
FIG. 3D is a schematic cross-sectional view showing a step in a method for manufacturing a light emitting module of the first embodiment of the present disclosure.

Next, as shown in FIG. 3D, an encapsulation member 40' covering the entire light emitting elements 30 is formed on the combined structure 60. The material of the encapsulation member is arranged on the resin member 50 and the wavelength conversion members 20 so as to bury the light emitting elements 30 and the light-transmitting attachment member 35. Thus, the entire light emitting elements 30 are covered by the encapsulation member 40'. The encapsulation member 40' can be formed by a method such as transfer molding, potting, printing, spraying, etc., for example.

Figure 3E:
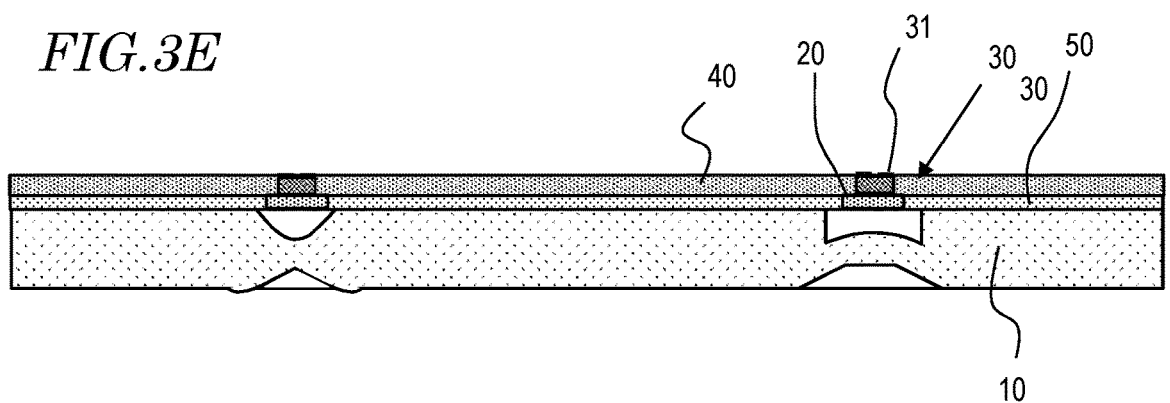
FIG. 3E is a schematic cross-sectional view showing a step in a method for manufacturing a light emitting module of the first embodiment of the present disclosure.

Next, the encapsulation member 40' is polished or ground from a second primary surface 40'b so as to expose the electrodes 31 of the light emitting elements 30. Polishing or grinding may be done by using a planarization technique such as a chemical method, e.g., CMP used for manufacturing semiconductor devices, or a mechanical method such as sandblast or grindstone. Then, as shown in FIG. 3E, the encapsulation member 40 is obtained that covers the lateral surface 30c of the light emitting element 30, with the surface of the electrode 31 exposed.

Figure 3F:
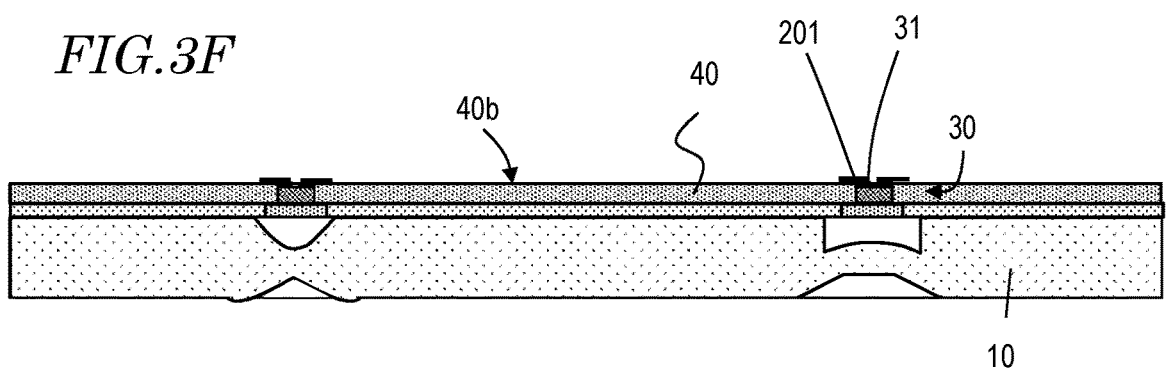
FIG. 3F is a schematic cross-sectional view showing a step in a method for manufacturing a light emitting module of the first embodiment of the present disclosure.

Next, a metal film having a layered structure of Cu/Ni/Au is formed entirely across the second primary surface 40b of the encapsulation member 40 covering the surfaces of the electrodes 31 by a thin film formation technique such as sputtering, and is patterned by laser abrasion in which the film is irradiated with laser light, thereby forming the interconnects 201 connected to the electrodes 31 on the second primary surface 40b of the encapsulation member 40 as shown in FIG. 3F.

Figure 3G:
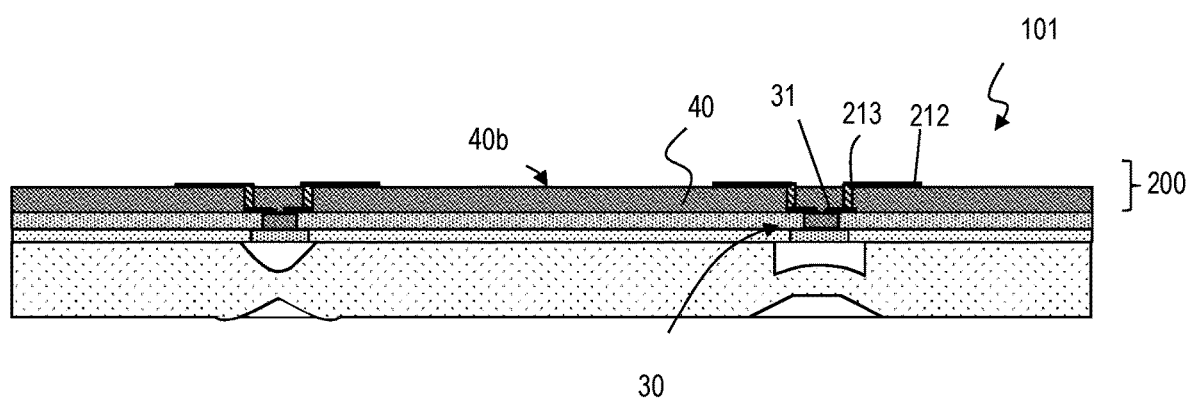
FIG. 3G is a schematic cross-sectional view showing a step in a method for manufacturing a light emitting module of the first embodiment of the present disclosure.

Next, as shown in FIG. 3G, the interconnect substrate 200 is arranged on the second primary surface 40b of the encapsulation member 40 with an adhesive sheet interposed therebetween, and the interconnect substrate 200 is pressure-bonded to the encapsulation member 40. At this point, the conductive member 213 is partially melted using pressure and heat, thereby electrically connecting the conductive member 213 and the interconnect 201 together. Thus, it is possible to obtain the light emitting module 101.

With the method for manufacturing a light emitting module of the present embodiment, the combined structure 60 including the wavelength conversion members 20 is attached to the second primary surface 10b of the lightguide plate 10. Therefore, even if the wavelength conversion member 20 is smaller than the opening of the recessed portion 12A, 12B of the lightguide plate 10, it is possible to arrange the wavelength conversion member 20 to be in contact with the recessed portion 12A, 12B, which is a void.

Second Embodiment

A second embodiment of a light emitting module of the present disclosure will now be described.

(Light Emitting Module 102)

Figure 4A:
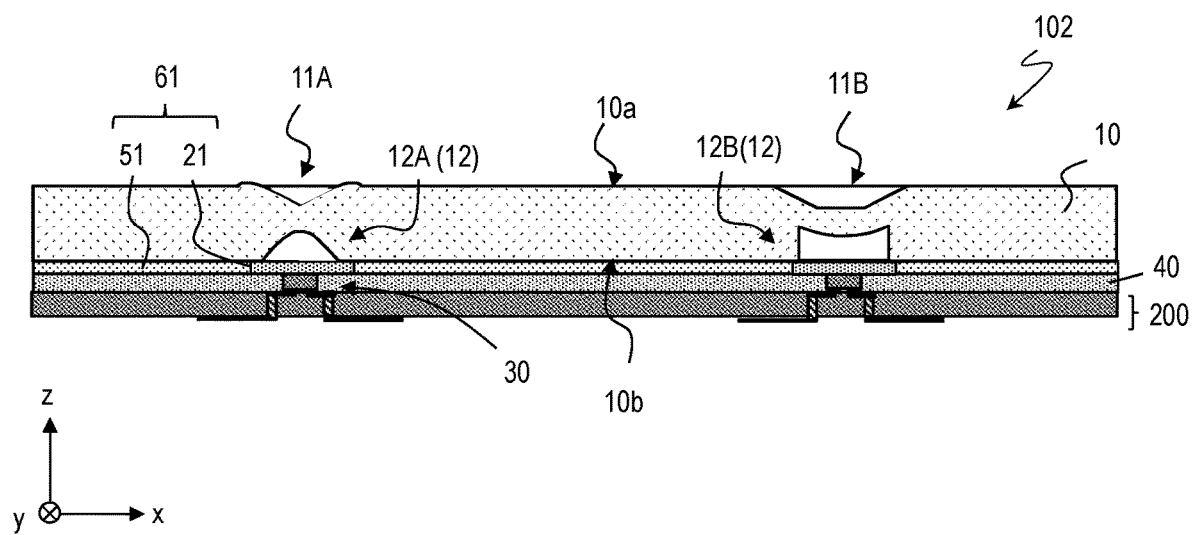
FIG. 4A is a schematic cross-sectional view of a light emitting module of a second embodiment of the present disclosure.
Figure 4B:
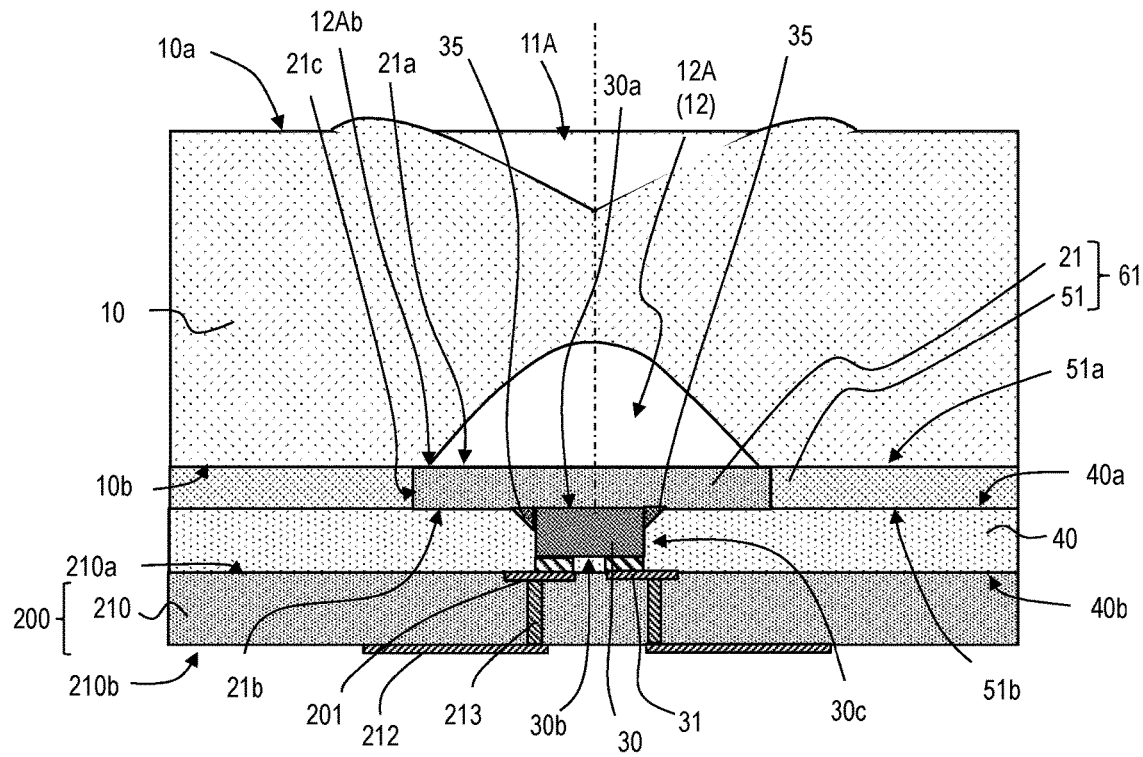
FIG. 4B is an enlarged schematic cross-sectional view showing a part of FIG. 4A.
Figure 4C:
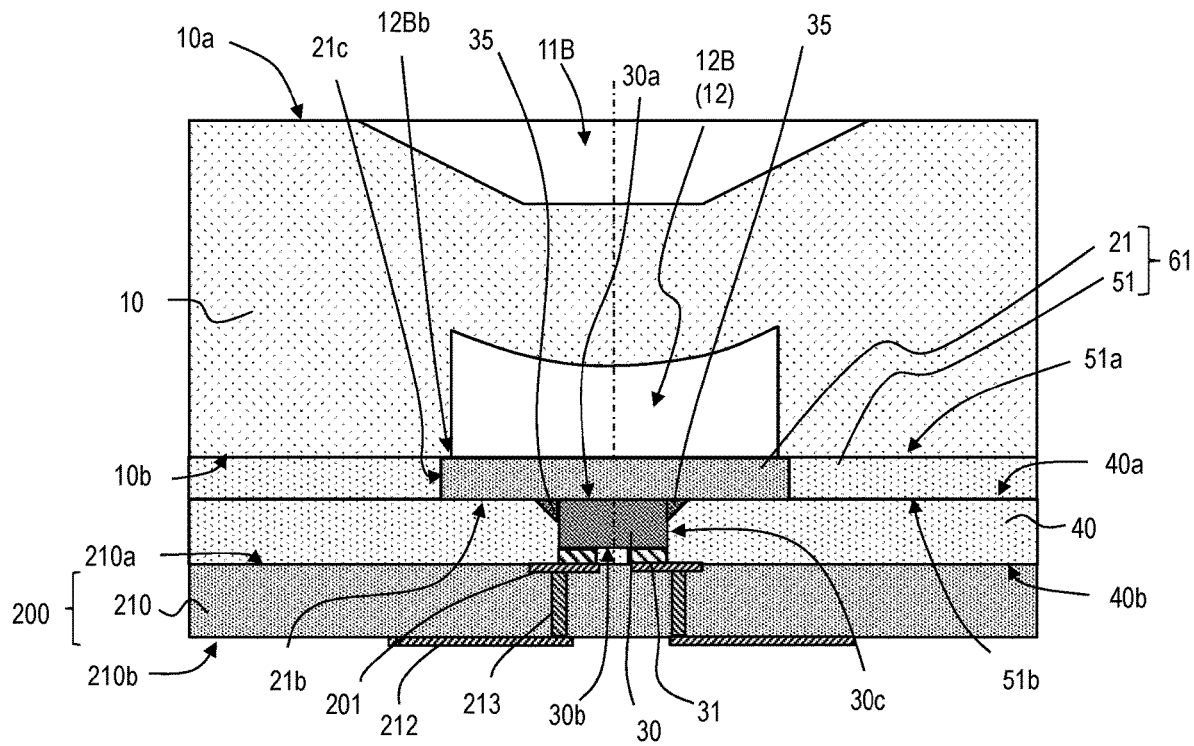
FIG. 4C is an enlarged schematic cross-sectional view showing another part of FIG. 4A.

The second embodiment of the light emitting module of the present disclosure will be described in detail. FIG. 4A is a schematic cross-sectional view of a light emitting module 102, and FIG. 4B and FIG. 4C are enlarged cross-sectional views showing a part of FIG. 4A. FIG. 4A shows a cross section at a position that corresponds to line 2B-2B of FIG. 2A.

The light emitting module 102 is different from the light emitting module 101 of the first embodiment in that it includes a combined structure 61 including wavelength conversion members 21 and a resin member 51, instead of the combined structure 60.

Contrary to the first embodiment, the wavelength conversion members 21 are larger than the recessed portions 12A and 12B in a plan view. That is, the wavelength conversion members 21 are located on the second primary surface 10b so as to cover the openings 12Ab and 12Bb of the recessed portions 12A and 12B on the second primary surface 10b. The resin member 51 is a resin layer in the present embodiment, and the combined structure 61 is not produced in advance as a separate member in the manufacture of the light emitting module 102.

As described in the first embodiment, the resin member 51 may be formed from a light-transmitting material or may be formed from a light-reflective material.

(Method for Manufacturing Light Emitting Module 102)

Referring to FIG. 5A to FIG. 5E, an example of a method for manufacturing a light emitting module of the present embodiment will now be described.

Figure 5A:
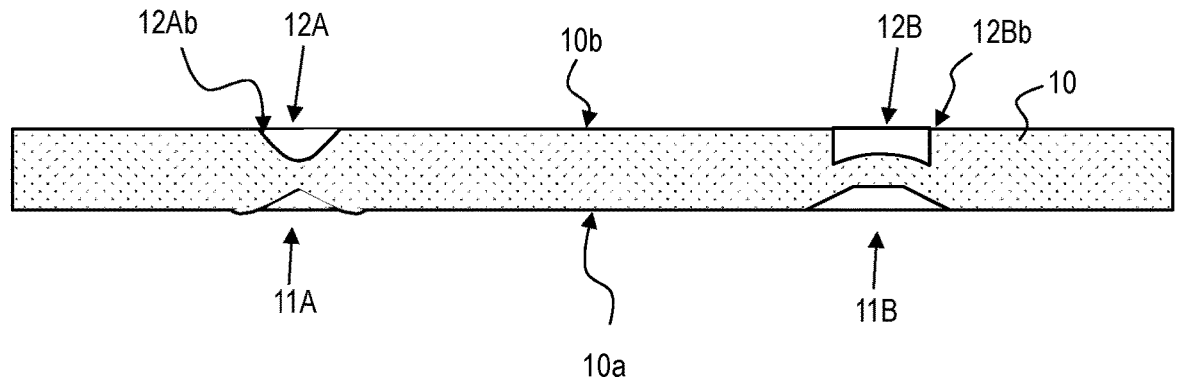
FIG. 5A is a schematic cross-sectional view showing a step in a method for manufacturing a light emitting module of the second embodiment of the present disclosure.

First, as shown in FIG. 5A, the lightguide plate 10 having the first primary surface 10a, the second primary surface 10b, and a plurality of recessed portions 12A and 12B on the second primary surface 10b is provided. For example, the lightguide plate 10 made of polycarbonate is provided by injection molding, with a plurality of optical function portions 11A and 11B provided on the first primary surface 10a and a plurality of recessed portions 12A and 12B provided on the second primary surface 10b.

Figure 5B:
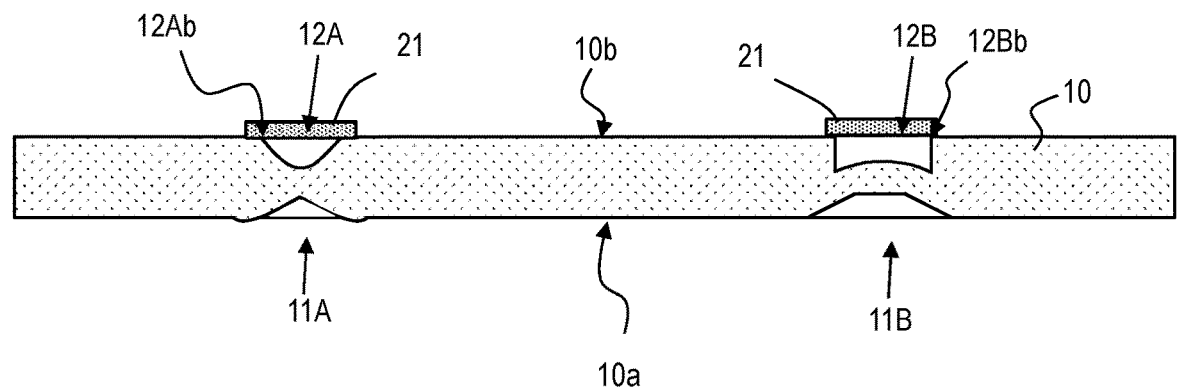
FIG. 5B is a schematic cross-sectional view showing a step in a method for manufacturing a light emitting module of the second embodiment of the present disclosure.

As shown in FIG. 5B, the wavelength conversion members 21 are arranged so as to cover the openings 12Ab and 12Bb of the recessed portions 12A and 12B on the second primary surface 10b. It is preferred that the wavelength conversion members 21 are secured on the lightguide plate 10 by an adhesive, or the like, so that the arranged wavelength conversion members 21 will not move out of position. An adhesive may be arranged in advance on the lightguide plate side, arranged in advance on the wavelength conversion member 21 side, or arranged in advance on both sides.

Figure 5C:
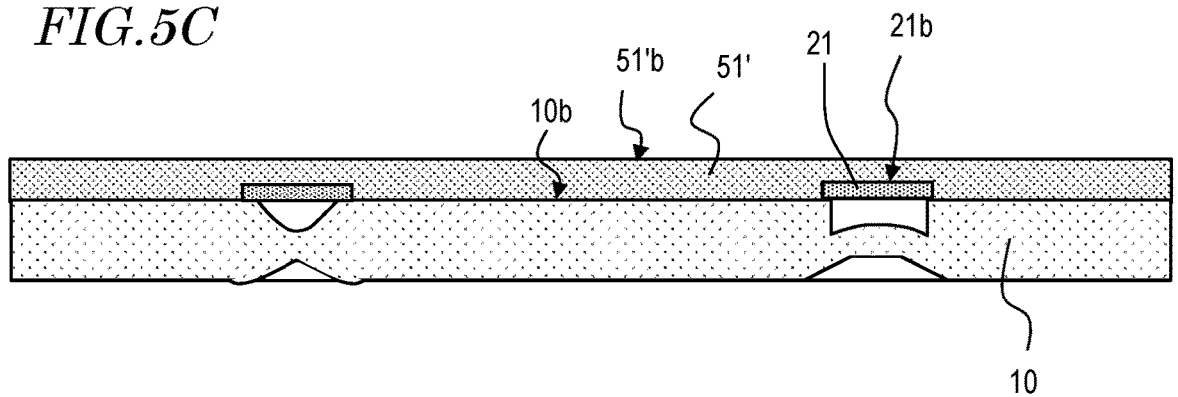
FIG. 5C is a schematic cross-sectional view showing a step in a method for manufacturing a light emitting module of the second embodiment of the present disclosure.

Next, as shown in FIG. 5C, a resin member 51' is formed on the second primary surface 10b of the lightguide plate 10 so as to entirely cover the wavelength conversion members 21. An uncured material of the resin member is arranged on the second primary surface 10b of the lightguide plate 10 so that the wavelength conversion members 21 are entirely buried therein, and the uncured material is allowed to cure. Thus, the wavelength conversion members 21 are entirely covered by the resin member 51'. The resin member 51' can be formed by a method such as transfer molding, potting, printing, spraying, etc., for example.

Figure 5D:
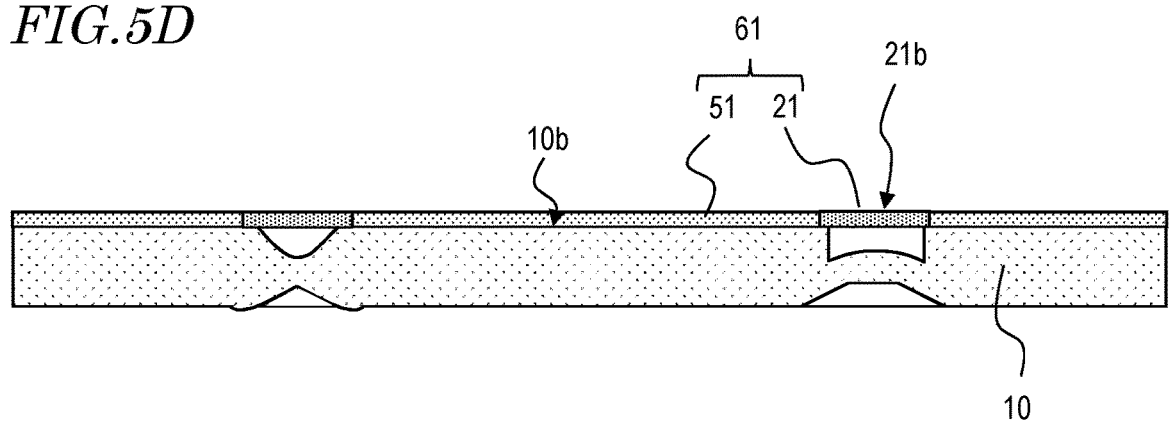
FIG. 5D is a schematic cross-sectional view showing a step in a method for manufacturing a light emitting module of the second embodiment of the present disclosure.

Next, the resin member 51' is polished or ground from a second primary surface 51'b so as to expose second primary surfaces 21b of the wavelength conversion members 21. Polishing or grinding may be done by using a planarization technique such as a chemical method, e.g., CMP used for manufacturing semiconductor devices, or a mechanical method such as sandblast or grindstone. Then, as shown in FIG. 5D, the resin member 51 is obtained that covers lateral surfaces 21c of the wavelength conversion members 21, with the second primary surfaces 21b exposed. That is, the combined structure 61 including the wavelength conversion members 21 and the resin member 51 is formed on the second primary surface 10b side of the lightguide plate 10.

Figure 5E:
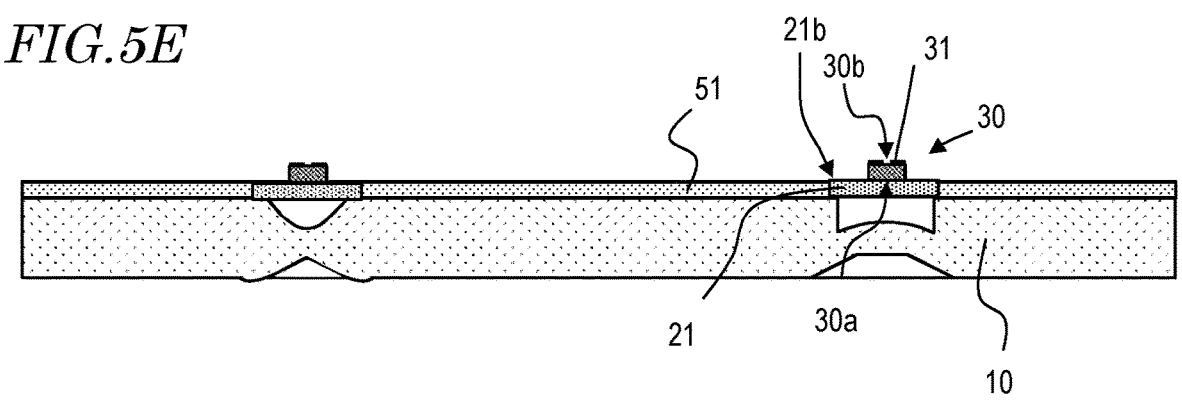
FIG. 5E is a schematic cross-sectional view showing a step in a method for manufacturing a light emitting module of the second embodiment of the present disclosure.

Then, as shown in FIG. 5E, the light emitting elements 30 are attached respectively to the wavelength conversion members 20 so that the primary light emitting surfaces 30a face the wavelength conversion members 20. Thereafter, the light emitting module 102 can be manufactured by a method similar to the first embodiment.

With the light emitting module 102, it is possible to realize a thin light emitting module as in the first embodiment. Since the combined structure 61 is not produced as a separate member, there is no need to produce the resin member 51 in accordance with the arrangement and the shape of the recessed portions 12A and 12B or to provide a mold for producing the resin member 51. Therefore, it is possible to reduce the manufacturing cost when producing light emitting modules 102 of different specifications.

(Variations)

Figure 6:
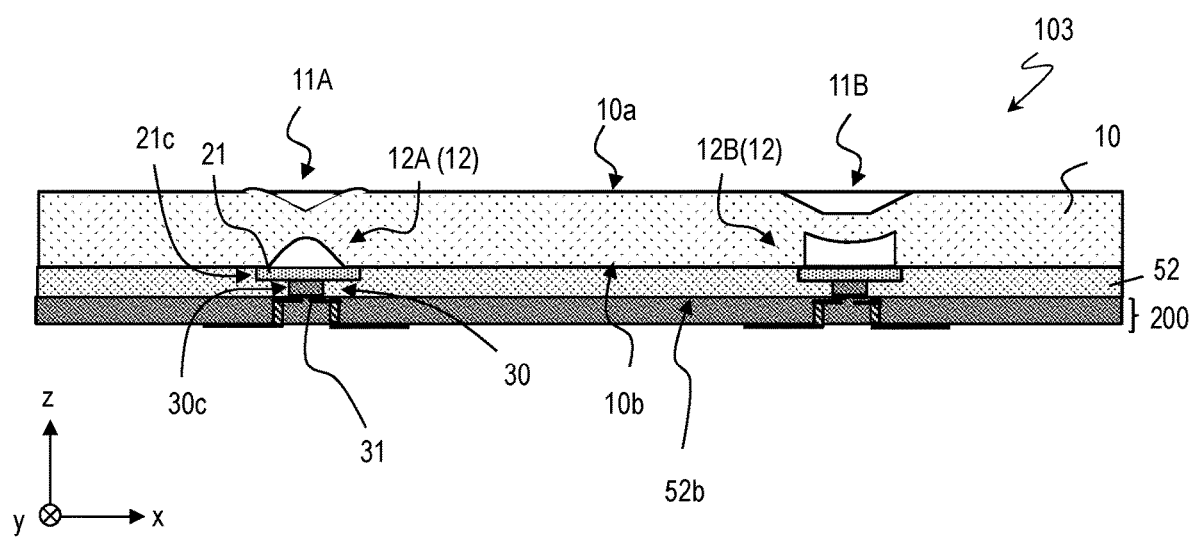
FIG. 6 is a schematic cross-sectional view of a light emitting module according to a variation of the second embodiment of the present disclosure.

With the light emitting module 102, the resin member 51 may be formed from a light-transmitting material or formed from a light-reflective material. When the resin member 51 is formed from a light-reflective material, the encapsulation member 40 and the resin member 51 can be formed integral together. A light emitting module 103 shown in FIG. 6 includes a resin member 52 that is arranged on the second primary surface of the lightguide plate 10, and covers the lateral surfaces 21c of the wavelength conversion members 21 and the lateral surfaces 30c of the light emitting elements 30. The resin member 52 is light-reflective, and is formed from a material that is used for the encapsulation member 40. The electrodes 31 of the light emitting elements 30 are exposed on a second primary surface 52b of the resin member 52.

Referring to FIG. 7A to FIG. 7E, a method for manufacturing the light emitting module 103 will be described.

Figure 7A:
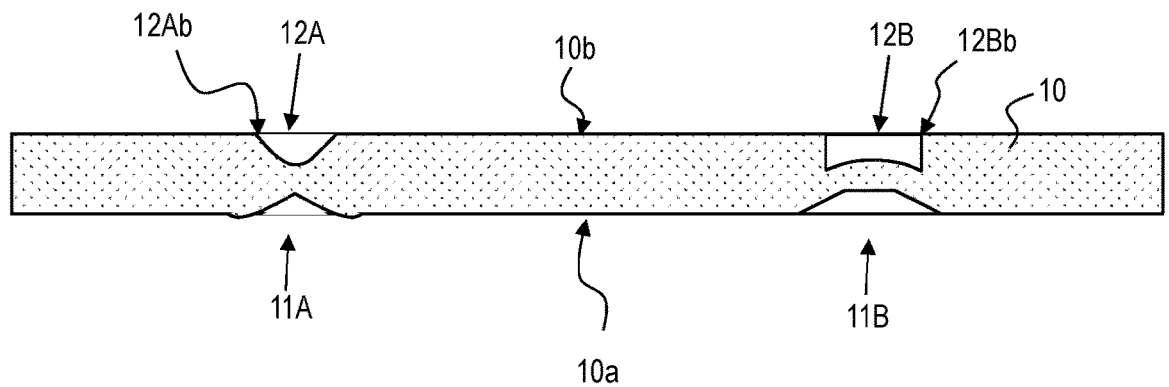
FIG. 7A is a schematic cross-sectional view showing a step in a method for manufacturing a light emitting module according to the variation of the second embodiment of the present disclosure.
Figure 7B:
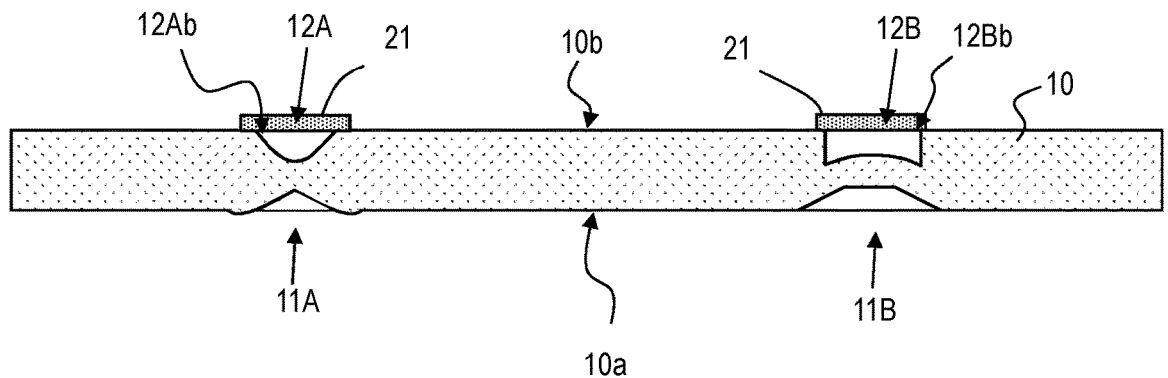
FIG. 7B is a schematic cross-sectional view showing a step in a method for manufacturing a light emitting module according to the variation of the second embodiment of the present disclosure.

As shown in FIG. 7A, the lightguide plate 10 is provided, and the wavelength conversion members 21 are arranged on the second primary surface 10b so as to cover the openings 12Ab and 12Bb of the recessed portions 12A and 12B on the second primary surface 10b as shown in FIG. 7B.

Figure 7C:
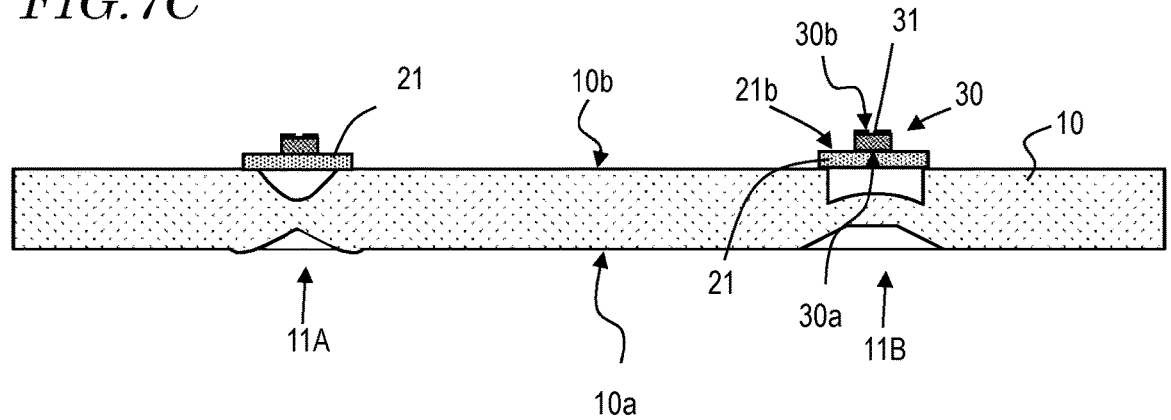
FIG. 7C is a schematic cross-sectional view showing a step in a method for manufacturing a light emitting module according to the variation of the second embodiment of the present disclosure.

Next, as shown in FIG. 7C, the light emitting elements 30 are attached respectively to the wavelength conversion members 21 so that the primary light emitting surfaces 30a face the wavelength conversion members 21.

Figure 7D:
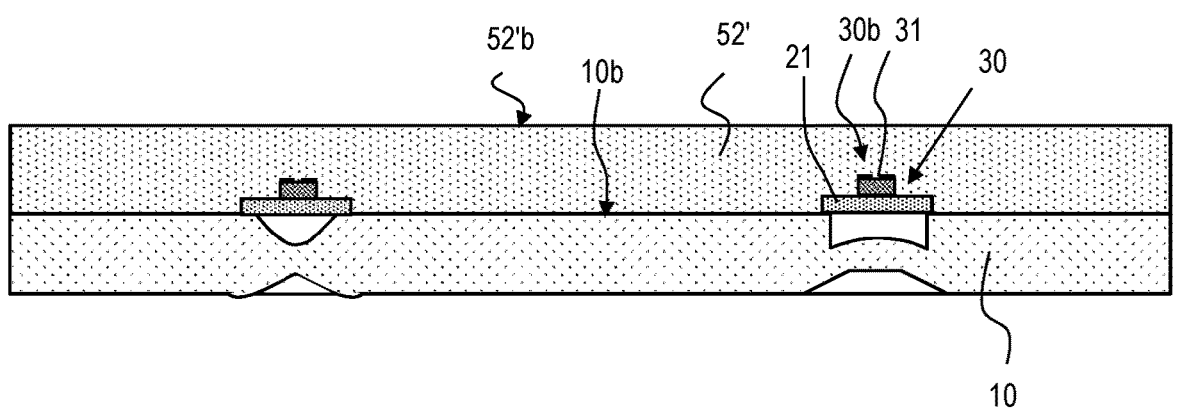
FIG. 7D is a schematic cross-sectional view showing a step in a method for manufacturing a light emitting module according to the variation of the second embodiment of the present disclosure.

As shown in FIG. 7D, a resin member 52' is formed on the second primary surface 10b of the lightguide plate 10 so as to entirely cover the wavelength conversion members 21 and the light emitting elements 30. An uncured material of the resin member is arranged on the second primary surface 10b of the lightguide plate 10 so that the wavelength conversion members 21 and the light emitting elements 30 are entirely buried therein, and the uncured material is allowed to cure. Thus, the light emitting elements 30 and the wavelength conversion members 21 are entirely covered by the resin member 52'. The resin member 52' can be formed by a method such as transfer molding, potting, printing, spraying, etc., for example.

Figure 7E:
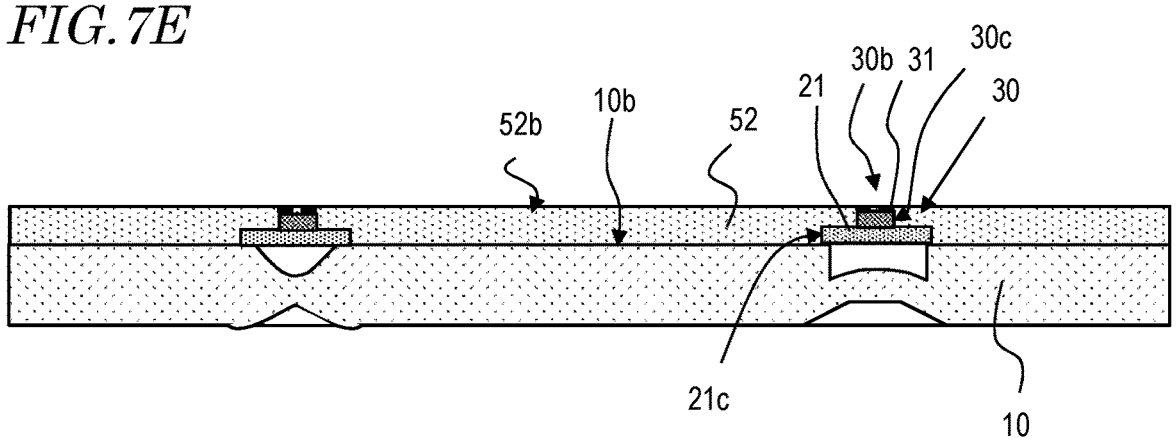
FIG. 7E is a schematic cross-sectional view showing a step in a method for manufacturing a light emitting module according to the variation of the second embodiment of the present disclosure.

Next, the resin member 52' is polished or ground from a second primary surface 52'b so as to expose the electrodes 31 of the light emitting elements 30. Polishing or grinding may be done by using a planarization technique such as a chemical method, e.g., CMP used for manufacturing semiconductor devices, or a mechanical method such as sandblast or grindstone. Then, as shown in FIG. 7E, the resin member 52 is obtained that covers the lateral surfaces 30c of the light emitting elements 30 and the lateral surfaces 21c of the wavelength conversion members 21, with the electrodes 31 exposed. Thereafter, the light emitting module 103 can be manufactured by a method similar to the first embodiment.

With the light emitting module 103, the resin member and the encapsulation member can be formed integral together, and it is therefore possible to reduce the number of manufacturing steps and to reduce the manufacturing cost.

Other Embodiments

Figure 8:
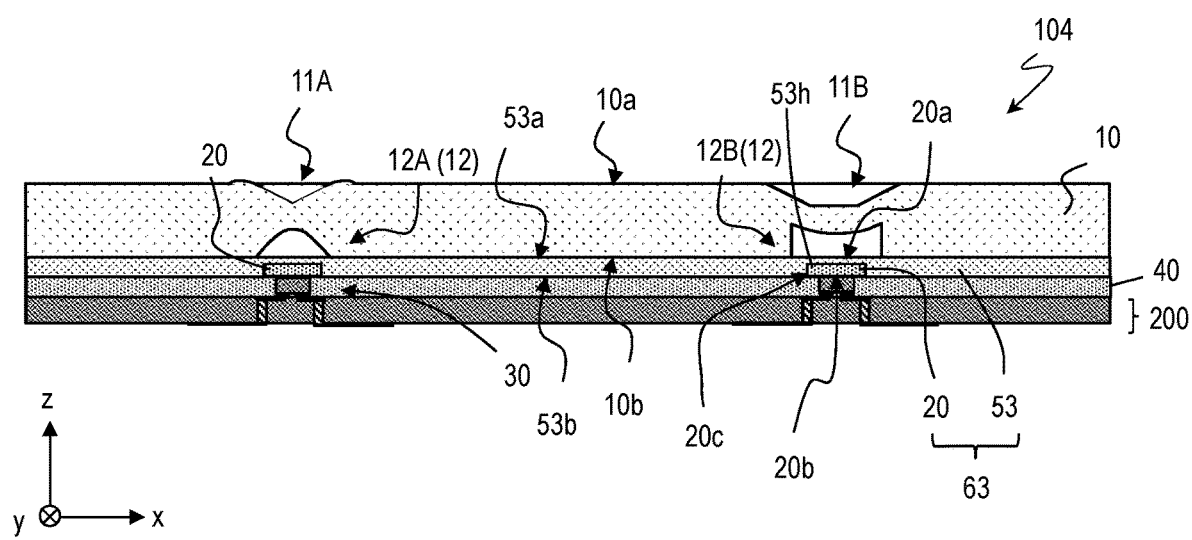
FIG. 8 is a schematic cross-sectional view of a light emitting module according to another embodiment of the present disclosure.

[Other Embodiments of Resin Member]
Various modifications can be made to the light emitting module of the present disclosure. With the light emitting module 101 of the first embodiment, the resin member 50 includes the through holes 50h for holding the wavelength conversion members 20, but the resin member may include recessed portions. A light emitting module 104 shown in FIG. 8 includes a resin member 53 that has a plurality of recessed portions 53h. The resin member 53 is a plate-shaped member, and includes a plurality of recessed portions 53h on a second primary surface 53b. This embodiment can suitably be combined with the first embodiment in cases where the resin member is light-transmitting and where the resin member is light-reflective.

The wavelength conversion members 20 are arranged in the recessed portions 53h of the resin member 53, and the resin member 53 covers the lateral surfaces 20c and a first primary surface 53a. The light emitting elements 30 are connected to the second primary surfaces 20b of the wavelength conversion members 20, which are not covered by the resin member 53.

With the light emitting module 104, a combined structure 63 including the wavelength conversion members 20 and the resin member 53 is formed by filling the recessed portions 53h of the resin member 53 with an uncured material of the wavelength conversion member 20, removing an excess material with a squeegee, or the like, and then allowing the material of the wavelength conversion members 20 to cure. Thus, it is easier to produce the combined structure 63.

Figure 9:
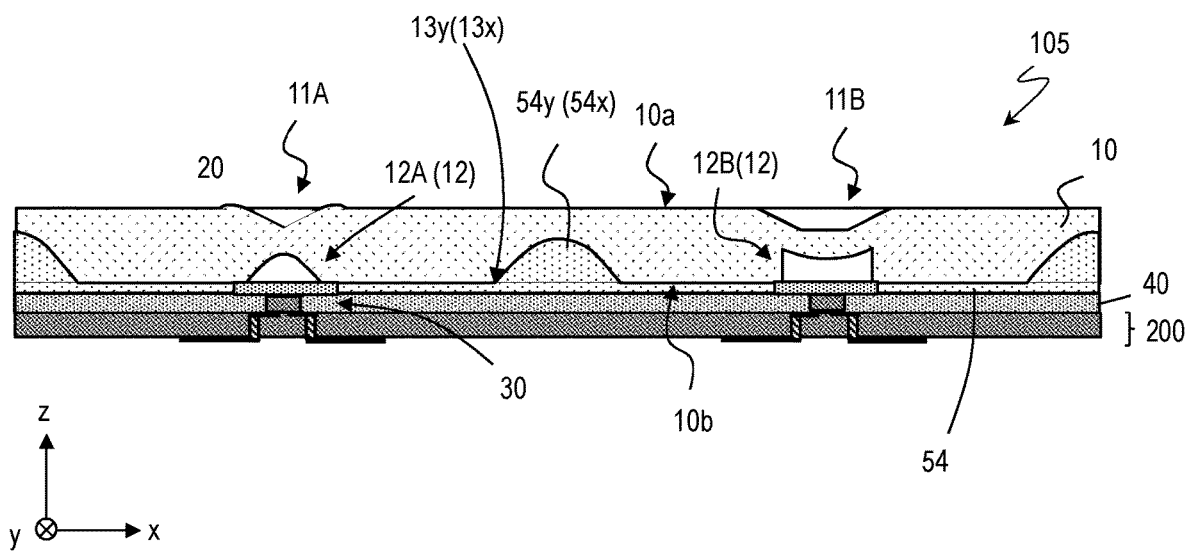
FIG. 9 is a schematic cross-sectional view of a light emitting module according to another embodiment of the present disclosure.
Figure 10:
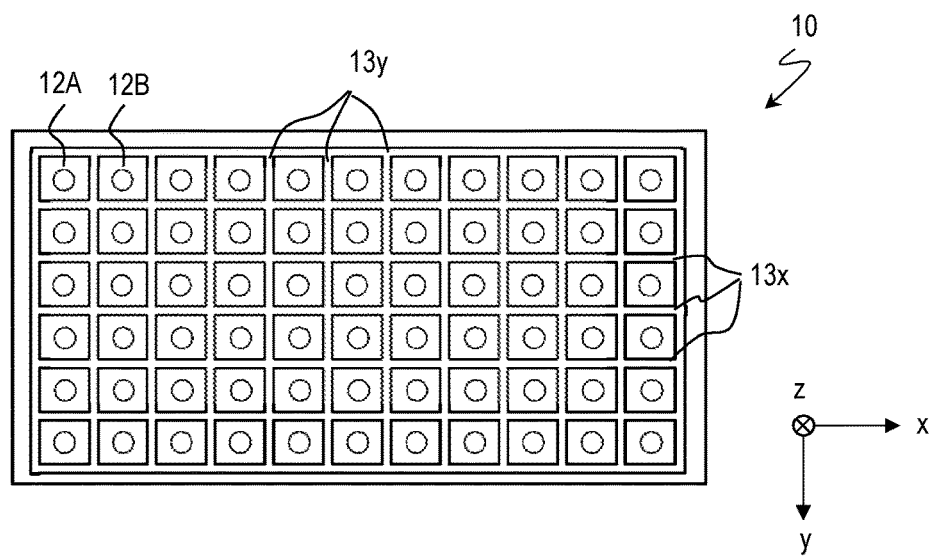
FIG. 10 is a schematic bottom view of a lightguide plate in the light emitting module shown in FIG. 9.

[Embodiment with Partition Members]
A light emitting module may include partition members that define light emitting unit regions. A light emitting module 105 shown in FIG. 9 is different from the light emitting module 103 in that it includes partition members 54x and 54y that define a plurality of light emitting elements. FIG. 10 is a bottom view showing the lightguide plate of the light emitting module 105. With the light emitting module 105, the lightguide plate 10 has a plurality of grooves 13x and a plurality of grooves 13y on the second primary surface 10b for arranging the partition members 54x and 54y therein. On the second primary surface 10b, the grooves 13x extend in the x direction, and are arranged between a plurality of rows of the recessed portions 12A and the recessed portions 12B arranged in the x direction. The grooves 13y extend in the y direction, and are arranged between a plurality of columns of the recessed portions 12A and the recessed portions 12B arranged in the y direction. The grooves 13x and the grooves 13y cross each other, and the recessed portions 12A and the recessed portions 12B are surrounded by the grooves 13x and the grooves 13y, and the regions surrounded by the grooves 13x and the grooves 13y each form a light emitting unit region of the light emitting module 105.

The partition members 54x and 54y are configured corresponding to the grooves 13x and 13y arranged on the second primary surface 10b. That is, the light emitting module 105 includes a plurality of partition members 54x and a plurality of partition members 54y buried into the lightguide plate 10 with respect to the second primary surface 10b. The partition members 54x extend in the x direction, and are arranged between rows of the recessed portions 12A and the recessed portions 12B arranged in the x direction. The partition members 54y extend in the y direction, and are arranged between columns of the recessed portions 12A and the recessed portions 12B arranged in the y direction. The recessed portions 12A or the recessed portions 12B are surrounded by the partition members 54x and the partition members 54y, and regions surrounded by the partition members 54x and the partition members 54y each form a light emitting unit region of the light emitting module 105.

The partition members 54x and 54y may be formed from a light-reflective material, and may be formed integral together with a resin member 54 by connecting the partition members 54x and 54y to the resin member 54.

Figure 11A:
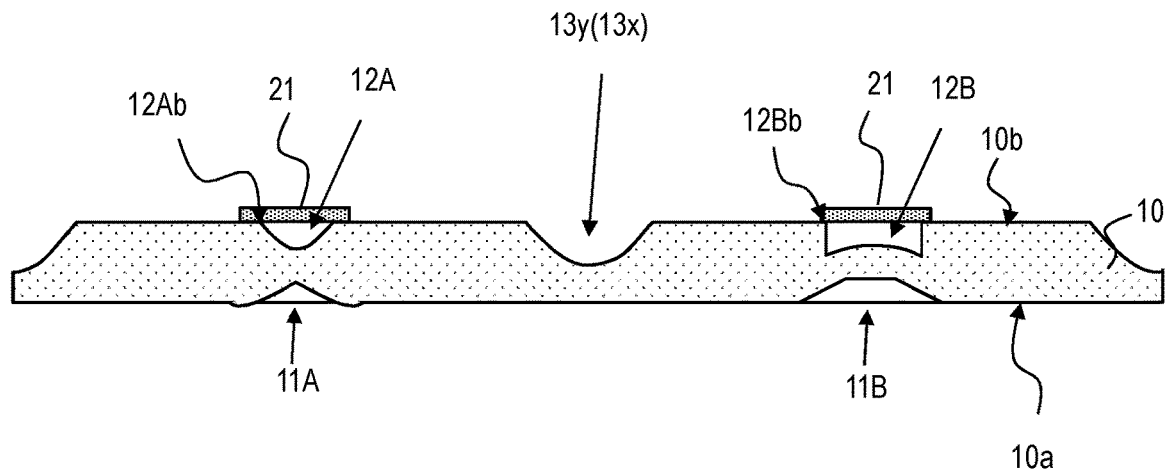
FIG. 11A is a schematic cross-sectional view showing a step in a method for manufacturing the light emitting module shown in FIG. 9.
Figure 11B:
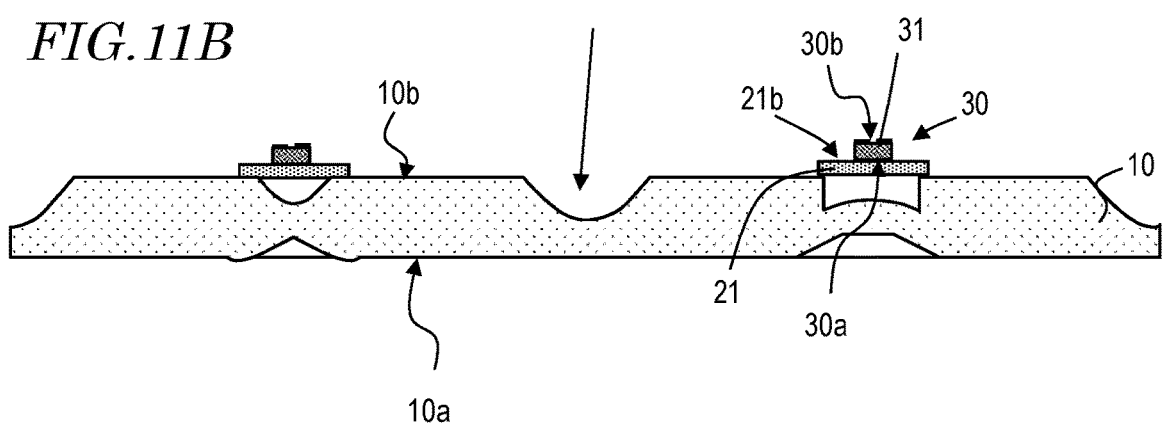
FIG. 11B is a schematic cross-sectional view showing a step in a method for manufacturing the light emitting module shown in FIG. 9.
Figure 11C:
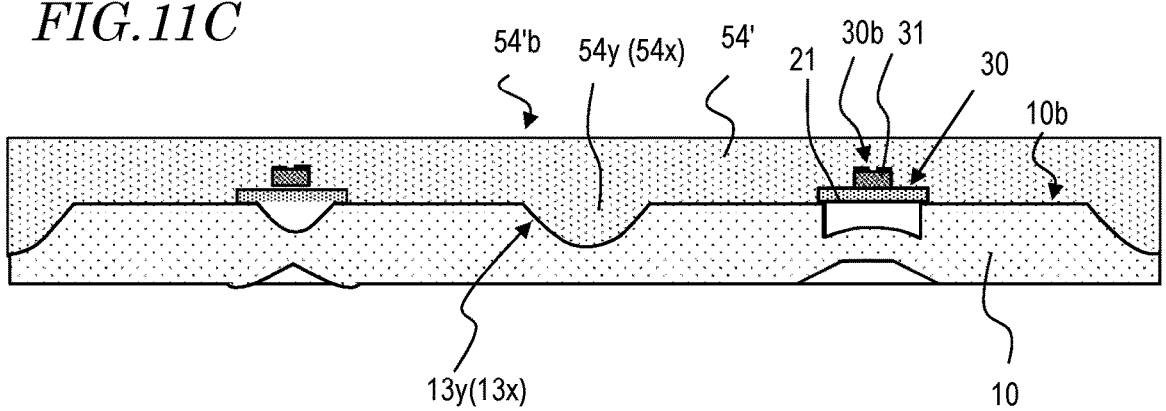
FIG. 11C is a schematic cross-sectional view showing a step in a method for manufacturing the light emitting module shown in FIG. 9.

Referring to FIG. 11A to FIG. 11C, a method for manufacturing the light emitting module 105 will be described. As shown in FIG. 11A, the lightguide plate 10 is provided, wherein a plurality of optical function portions 11A and 11B are provided on the first primary surface 10a, and a plurality of recessed portions 12A and 12B and a plurality of grooves 13x and 13y are provided on the second primary surface 10b.

Next, the wavelength conversion members 21 are arranged on the second primary surface 10b so as to cover the openings 12Ab and 12Bb of the recessed portions 12A and 12B on the second primary surface 10b. Moreover, as shown in FIG. 11B, the light emitting elements 30 are attached respectively to the wavelength conversion members 20.

As shown in FIG. 11C, a resin member 54' is formed on the second primary surface 10b of the lightguide plate 10 so as to entirely cover the wavelength conversion members 21 and the light emitting elements 30. An uncured material of the resin member is arranged on the second primary surface 10b of the lightguide plate 10 so that the grooves 13x and 13y on the lightguide plate 10 are buried therein and the wavelength conversion members 21 and the light emitting elements 30 are entirely buried therein. Thus, the light emitting elements 30 and the wavelength conversion members 21 are entirely covered by the resin member 52'. The partition members 54x and 54y are formed in the grooves 13x and 13y. The resin member 54' can be formed by a method such as transfer molding, potting, printing, spraying, etc., for example.

Figure 11D:
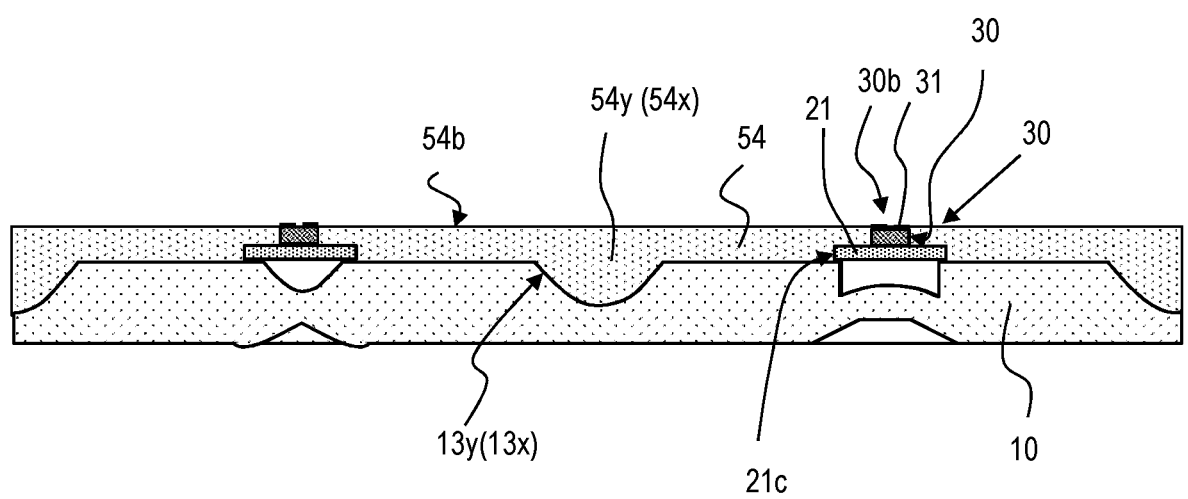
FIG. 11D is a schematic cross-sectional view showing a step in a method for manufacturing the light emitting module shown in FIG. 9.

Next, in a similar manner, the resin member 54' is polished or ground from a second primary surface 54'b so as to expose the electrodes 31 of the light emitting elements 30, thereby obtaining the resin member 54 that covers the lateral surfaces 30c of the light emitting elements 30 and the lateral surfaces 21c of the wavelength conversion members 21, with the electrodes 31 exposed, as shown in FIG. 11D. Thereafter, the light emitting module 105 can be manufactured by a method similar to the first embodiment.

With the light emitting module 105 including the partition members 54x and 54y, light emitted from each light emitting element 30 is reflected by the partition members 54x and 54y that surround the recessed portion 12A or 12B corresponding to the light emitting element 30 to be emitted from the first primary surface 10a. When the light emitting module 105 is partially driven, it is possible to increase the bright-dark contrast, and it is possible to realize the liquid crystal display device 1000 capable of displaying an image that has a high contrast.

This embodiment can suitably be used when the partition members are formed integral with the resin member, i.e., when the resin member is light-reflective in the second embodiment. However, if the partition members and the resin member are provided as separate members, it can also be used when the resin member is light-transmitting in the first embodiment and the second embodiment. Specifically, a lightguide plate having a plurality of grooves 13x and 13y on the second primary surface 10b may be provided, and the partition members 54x and 54y may be formed in the grooves 13x and 13y by a method described above before the resin member is attached or formed.

[Embodiment with Light-Transmitting Low-Refractive Index Member]

According to the previous embodiments, the recessed portions 12A and 12B formed on the second primary surface 10b of the lightguide plate 10 are voids. However, some or all of the recessed portions 12A and 12B may be filled with a light-transmitting low-refractive index member having a lower refractive index than the material of the lightguide plate 10.

Figure 12:
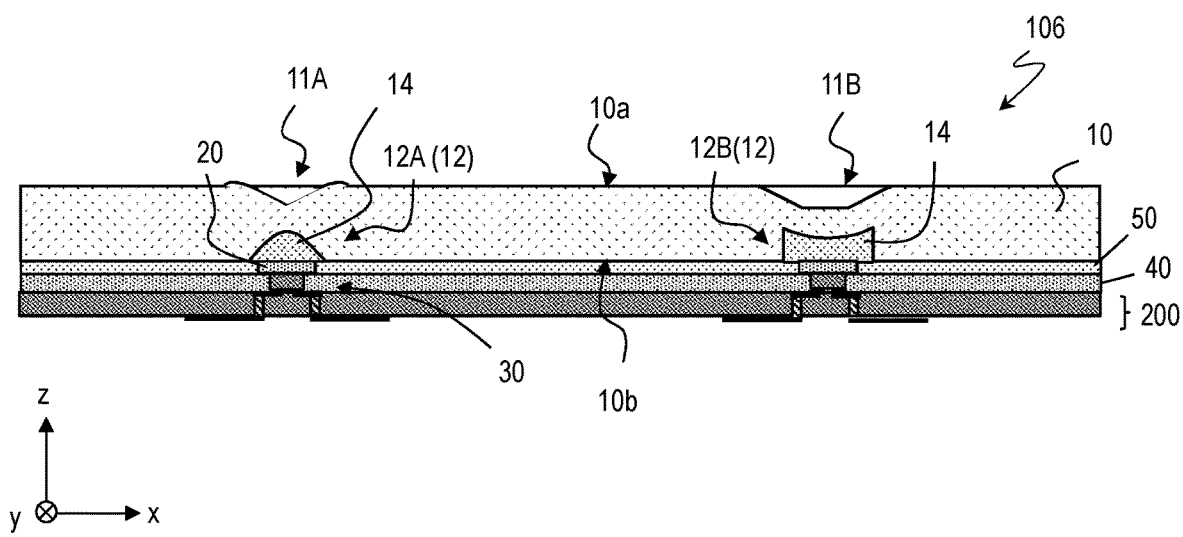
FIG. 12 is a schematic cross-sectional view of a light emitting module according to another embodiment of the present disclosure.
Figure 13:
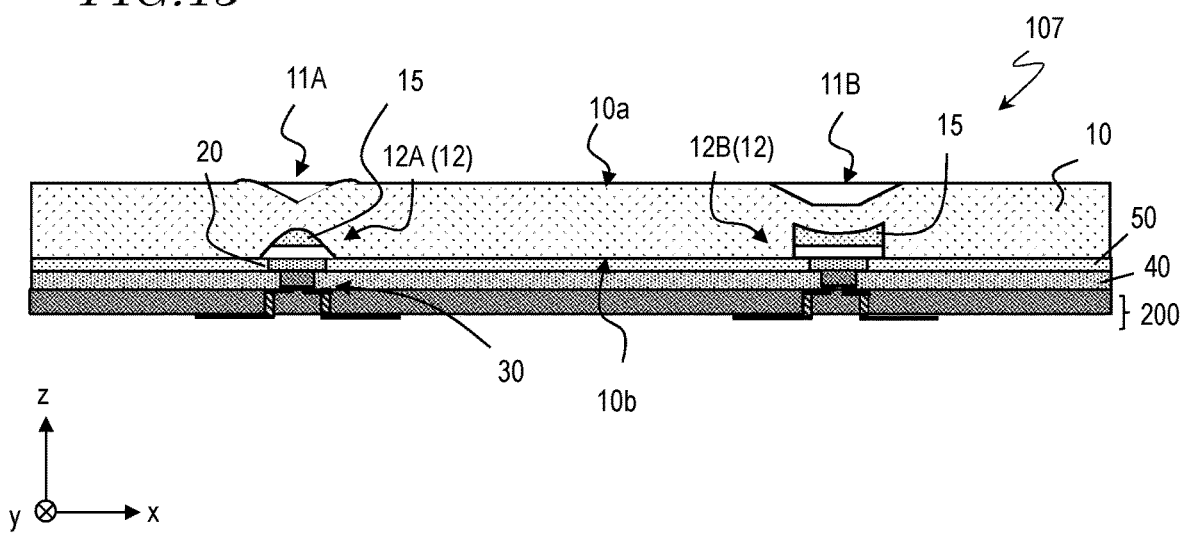
FIG. 13 is a schematic cross-sectional view of a light emitting module according to another embodiment of the present disclosure.

A light emitting module 106 shown in FIG. 12 further includes a light-transmitting low-refractive index member 14 having a lower refractive index than the lightguide plate 10 and filling the recessed portions 12A and 12B. A light emitting module 107 shown in FIG. 13 further includes a light-transmitting low-refractive index member 15 having a lower refractive index than the lightguide plate 10 and the light-transmitting low-refractive index member 15 may fill a portion of each of the recessed portions 12A and 12B, wherein the remaining portion of each of the recessed portions 12A and 12B may be a void. In other words, in each recessed portion 12A, 12B, a void may be provided between the light-transmitting low-refractive index member 15 and the wavelength conversion member 20.

The light-transmitting low-refractive index member 14, 15 is transmissive for light emitted from the light emitting element 30, and has a smaller refractive index than the lightguide plate 10. The light-transmitting low-refractive index member 14, 15 may be of a light-transmitting thermosetting resin material such as an epoxy resin or a silicone resin, etc. For example, when the lightguide plate 10 made of polycarbonate is used, a silicone resin, or the like, can suitably be used.

The light-transmitting low-refractive index member 14, 15 may further include a diffuser contained in the resin described above. Examples of the diffuser include silicon oxide, aluminum oxide, zirconium oxide, zinc oxide, etc. The light-transmitting low-refractive index member 14, 15 may include one or two or more of these diffusers. A white pigment may be included as a diffuser. Examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, etc., for example. The light-transmitting low-refractive index member 14, 15 may include one or two or more of these white pigments.

With the light emitting module 106, 107, the lightguide plate 10 having the light-transmitting low-refractive index members 14, 15 arranged in the recessed portions 12A and 12B can be obtained by providing the lightguide plate 10, filling the recessed portions 12A and 12B with the material of the light-transmitting low-refractive index member to a predetermined height from the bottom of the recessed portions 12A and 12B, and then allowing the material of the light-transmitting low-refractive index member to cure.

Even with the light-transmitting low-refractive index members 14, 15 provided in the recessed portions 12A and 12B, when light emitted from the light emitting element 30 enters the lightguide plate 10 from the recessed portion 12, the light passes through a region of a low refractive index and then through a region of a high refractive index. Therefore, no total reflection occurs at the interface between the recessed portion 12 and the lightguide plate 10, and it is possible to improve the light extraction efficiency of the light emitting module 106, 107.

This embodiment can suitably be used both when the resin member is light-transmitting and when the resin member is light-reflective in the first embodiment and the second embodiment. Particularly, when the recessed portions 12A and 12B are all filled with the light-transmitting low-refractive index member 14 as in the light emitting module 107, the light-transmitting low-refractive index member 14 can support the wavelength conversion members 20. Therefore, when a light emitting module is manufactured by the manufacturing method of the second embodiment using a resin layer as a resin member, the wavelength conversion members 20 smaller than the recessed portions 12A and 12B in a plan view can be used.

[Other Embodiments for Arrangement of Optical Function Portions]

Figure 14A:
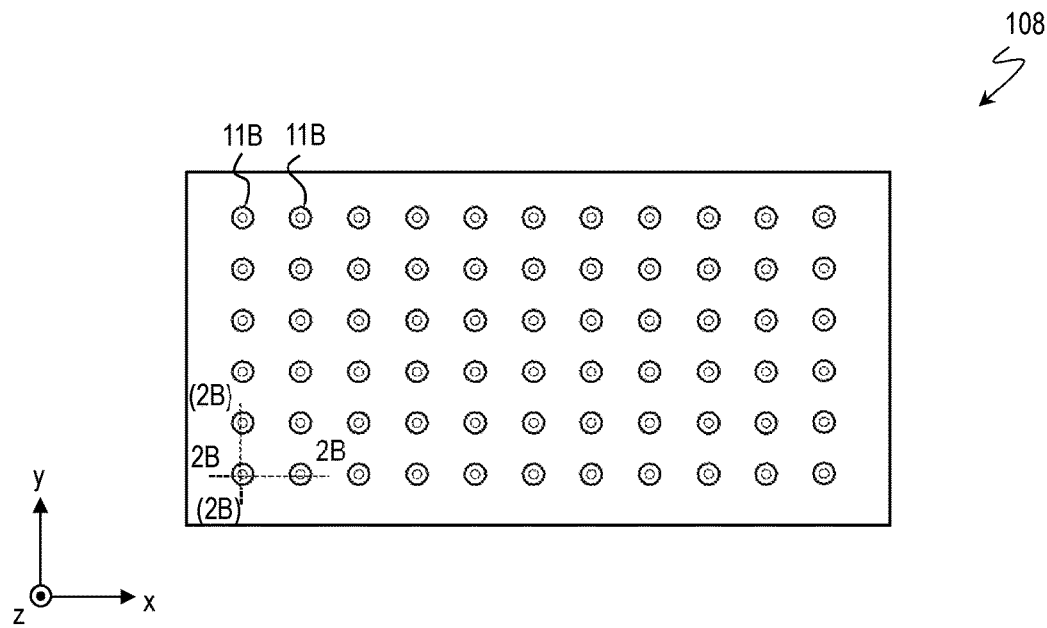
FIG. 14A is a schematic top view of a light emitting module according to another embodiment of the present disclosure.
Figure 14B:
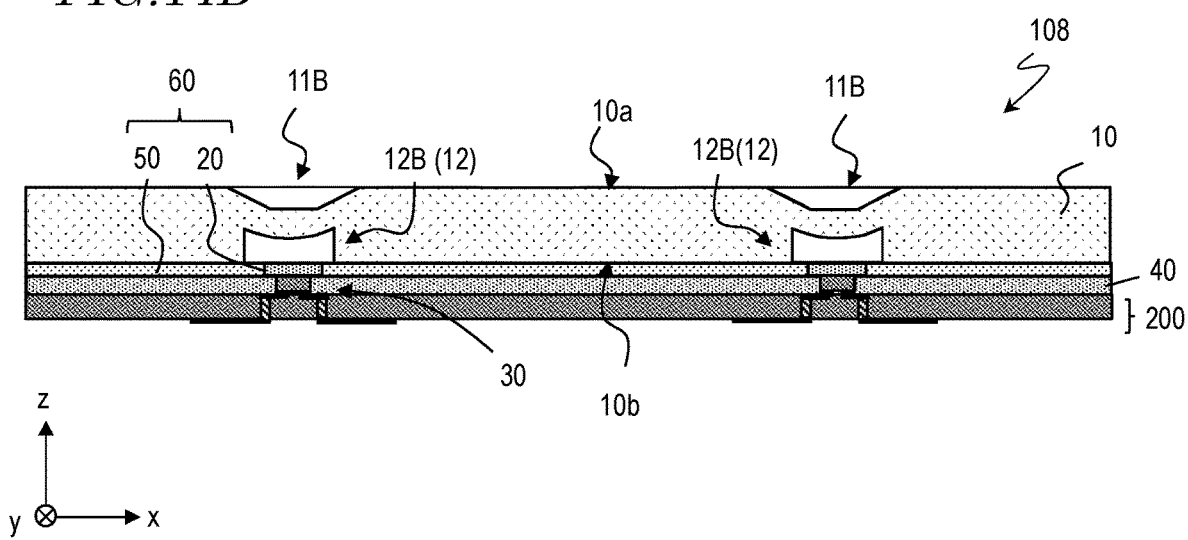
FIG. 14B is a schematic cross-sectional view of a light emitting module taken along line 2B-2B of FIG. 14A.

In the embodiment described above, a light emitting module includes a lightguide plate in which two types of optical function portions are arranged. However, optical function portions of only one type may be provided in the lightguide plate. FIG. 14A is a schematic top view showing a light emitting module 108 of such an embodiment, FIG. 14B is a schematic cross-sectional view showing the light emitting module 108 taken along line 2B-2B of FIG. 14A. The light emitting module 108 includes only a plurality of optical function portions 11B arranged two-dimensionally on the first primary surface 10a of the lightguide plate 10. It includes only a plurality of recessed portions (second recessed portions) 12B on the second primary surface 10b of the lightguide plate 10.

In addition, a light emitting module may include only the optical function portions 11A and the recessed portions 12A, or may include only a plurality of recessed portions 12A or a plurality of recessed portions 12B without including the optical function portions 11A and 11B.

The light emitting module of the present disclosure is applicable to various surface-emitting light sources, and can be used as a backlight of a liquid crystal display device, for example.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting module comprising:
   a plurality of light emitting elements each having a primary light emitting surface;
   a plurality of wavelength conversion members arranged respectively on the primary light emitting surfaces of the plurality of light emitting elements; and
   a resin member arranged between the plurality of wavelength conversion members and covering lateral surfaces of the plurality of wavelength conversion members; and
   a lightguide plate having a first primary surface and a second primary surface, and arranged on the resin member and the plurality of wavelength conversion members so that the second primary surface faces the resin member and the plurality of wavelength conversion members, wherein the lightguide plate includes a plurality of recessed portions on the second primary surface that are located over the plurality of wavelength conversion members; and
   a light-transmitting low-refractive index member having a lower refractive index than the lightguide plate and filling at least a portion of each of the plurality of recessed portions, wherein the light-transmitting low-refractive index member includes a resin material,
   wherein each of the plurality of light emitting elements is positioned outside a corresponding recessed portion on the second primary surface of the light guide plate.

2. The light emitting module according to claim 1, wherein the resin member is light-transmitting.

3. The light emitting module according to claim 1, wherein the resin member is light-reflective.

4. The light emitting module according to claim 1, wherein at least one of the plurality of wavelength conversion members is larger than one of the plurality of recessed portions in a plan view.

5. The light emitting module according to claim 1, wherein at least one of the plurality of wavelength conversion members is smaller than one of the plurality of recessed portions in a plan view.

6. The light emitting module according to claim 1, wherein:
   one or more of the plurality of wavelength conversion member each has a first primary surface that faces the second primary surface of the lightguide plate; and
   the resin member further covers the second primary surface of the lightguide plate.

7. The light emitting module according to claim 1, wherein the plurality of recessed portions include a plurality of first recessed portions and a plurality of second recessed portions, wherein a bottom of each of the plurality of first recessed portions has a different shape than a bottom of each of the plurality of second recessed portions.

8. The light emitting module according to claim 7, wherein a bottom of each of the plurality of first recessed portions has a shape that is protruding toward the first primary surface side of the lightguide plate, and a bottom of each of the plurality of second recessed portions has a shape that is protruding toward the second primary surface side of the lightguide plate.

9. The light emitting module according to claim 1, wherein the lightguide plate further includes a plurality of optical function portions arranged on the first primary surface of the lightguide plate at positions corresponding to the recessed portions on the second primary surface of the lightguide plate.

10. The light emitting module according to claim 9, wherein optical axes of the plurality of optical function portions generally coincide with optical axes of the plurality of recessed portions on the second primary surface of the lightguide plate.

11. The light emitting module according to claim 1, wherein the light-transmitting low-refractive index member fills the portion of each of the plurality of recessed portions, and a remaining portion of said each of the plurality of recessed portions is a void.

12. The light emitting module according to claim 1, further comprising a diffuser in the light-transmitting low-refractive index member.

13. A method for manufacturing a light emitting module comprising the steps of:
   providing a lightguide plate having a first primary surface and a second primary surface, and a plurality of recessed portions provided on the second primary surface;
   arranging a combined structure on the second primary surface of the lightguide plate, wherein the combined structure includes a plurality of wavelength conversion members located respectively at openings of the plurality of recessed portions, and a resin member arranged between the plurality of wavelength conversion members so as to cover lateral surfaces of the plurality of wavelength conversion members;
   filling at least a portion of each of the plurality of recessed portions with a light-transmitting low-refractive index member having a lower refractive index than the lightguide plate, wherein the light-transmitting low-refractive index member includes a resin material; and
   attaching a plurality of light emitting elements respectively to the plurality of wavelength conversion members,
   wherein each of the plurality of light emitting elements is positioned outside a corresponding recessed portion on the second primary surface of the light guide plate.

14. The method for manufacturing a light emitting module according to claim 13, wherein the light-transmitting low-refractive index member fills the portion of each of the plurality of recessed portions, and a remaining portion of said each of the plurality of recessed portions is a void.

15. The method for manufacturing a light emitting module according to claim 14, wherein:
the resin member is a resin plate;
arranging the combined structure includes:
providing a resin plate having a plurality of through holes and a plurality of recessed portions, arranging the plurality of wavelength conversion members respectively in the plurality of through holes or the plurality of recessed portions, thereby forming the combined structure; and
attaching the combined structure to the second primary surface of the lightguide plate.

16. The method for manufacturing a light emitting module according to claim 15, wherein forming the combined structure further includes attaching the plurality of light emitting elements each having a primary light emitting surface respectively to the plurality of wavelength conversion members so that the primary light emitting surfaces face the plurality of wavelength conversion members.

17. The method for manufacturing a light emitting module according to claim 16, wherein the resin plate is light-transmitting.

18. The method for manufacturing a light emitting module according to claim 16, wherein the resin plate is light-reflective.

19. The method for manufacturing a light emitting module according to claim 14, wherein:
the resin member is a resin layer; and
arranging the combined structure includes:
arranging the plurality of wavelength conversion members so as to cover one or more openings of the plurality of recessed portions; and
forming the resin layer on the second primary surface of the lightguide plate so as to cover lateral surfaces of one or more of the plurality of wavelength conversion members.

20. The method for manufacturing a light emitting module according to claim 19, wherein the resin layer is light-transmitting.

21. The method for manufacturing a light emitting module according to claim 19, wherein the resin layer is light-reflective.

22. The method for manufacturing a light emitting module according to claim 13, wherein:
the resin member is a resin layer; and
arranging the combined structure includes:
attaching the plurality of wavelength conversion members respectively on a light-transmitting low-refractive index member filling the plurality of recessed portions; and
arranging the resin layer on the second primary surface of the lightguide plate so as to cover lateral surfaces of one or more of the plurality of wavelength conversion members.

* * * * *